United States Patent
Inoue et al.

(10) Patent No.: US 6,750,630 B2
(45) Date of Patent: Jun. 15, 2004

(54) BATTERY TEMPERATURE CONTROL DEVICE FOR CONTROLLING THE TEMPERATURE OF A BATTERY INSTALLED IN VEHICLE WHICH INCLUDES AN AIR PASSAGE TO THE BATTERY FROM A REAR AIR-CONDITIONING UNIT

(75) Inventors: Yoshimitsu Inoue, Chiryu (JP); Hiroshi Nonoyama, Toyota (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/280,809

(22) Filed: Oct. 25, 2002

(65) Prior Publication Data

US 2003/0080714 A1 May 1, 2003

(30) Foreign Application Priority Data

| Oct. 29, 2001 | (JP) | ........................................ | 2001-331250 |
| Apr. 23, 2002 | (JP) | ........................................ | 2002-120599 |
| Sep. 3, 2002 | (JP) | ........................................ | 2002-257870 |

(51) Int. Cl.⁷ .............................................. H01M 10/46

(52) U.S. Cl. ...................................................... 320/104

(58) Field of Search ................................ 320/104, 112, 320/138, 150, 153

(56) References Cited

U.S. PATENT DOCUMENTS

| 5,490,572 | A | * | 2/1996 | Tajiri et al. ................. 180/65.1 |
| 5,937,664 | A | * | 8/1999 | Matsuno et al. ............ 62/259.2 |
| 6,188,574 | B1 | * | 2/2001 | Anazawa ..................... 361/695 |
| 6,315,069 | B1 | * | 11/2001 | Suba et al. ................. 180/68.5 |

FOREIGN PATENT DOCUMENTS

| JP | 8-40088 | 2/1996 |
| JP | 10-252467 | 9/1998 |

* cited by examiner

Primary Examiner—Edward H. Tso
(74) Attorney, Agent, or Firm—Harness, Dickey & Pierce, PLC

(57) ABSTRACT

Air for cooling a battery is supplied to the battery from a rear unit through a duct. In this way, the temperature of the air blown to the battery can be reduced in comparison to a case where inside air is taken from a passenger compartment and is supplied to the battery for cooling the battery. Thus, the battery can be sufficiently cooled, so that the amount of air flow supplied to the battery needs not be increased to achieve enough cooling capacity for cooling the battery. As a result, air blowing noises can be reduced, and a reduction in a service life of a second blower can be restrained. Furthermore, since sufficient cooling capacity is achieved, there is no need to increase a radiating surface area of the battery. Thus, an increase in a size of the battery and an increase in a manufacturing cost can be restrained.

12 Claims, 15 Drawing Sheets

| | A/C ON | | A/C OFF | |
|---|---|---|---|---|
| | Tb>c | Tb≦c | Tb>c | Tb≦c |
| OPERATION BASED ON BAT. TEMP. Tb | REAR EVAPO. ON | REAR EVAPO. OFF (AIR COOLING ONLY) | REAR EVAPO. SOLO OPERATION | COMP. OFF (AIR COOLING ONLY) |
| INSIDE/ OUTSIDE AIR | INSIDE AIR TEMP.< OUTSIDE AIR TEMP. INSIDE AIR MODE | | INSIDE AIR TEMP.> OUTSIDE AIR TEMP. OUTSIDE AIR MODE | |

BATTERY TEMPERATURE CONTROL DEVICE FOR CONTROLLING THE TEMPERATURE OF A BATTERY INSTALLED IN VEHICLE WHICH INCLUDES AN AIR PASSAGE TO THE BATTERY FROM A REAR AIR-CONDITIONING UNIT

CROSS REFERENCE TO RELATED APPLICATION

This application is based on and incorporates herein by reference Japanese Patent Application No. 2001-331250 filed on Oct. 29, 2001, Japanese Patent Application No. 2002-120599 filed on Apr. 23, 2002, and Japanese Patent Application No. 2002-257870 filed on Sep. 3, 2002.

BACKGROUND OF THE INVENTION

1. Field of the Invention

The present invention relates to a battery temperature control device for controlling the temperature of a battery installed in a vehicle.

2. Description of Related Art

Japanese unexamined patent publication No. 10-252467 discloses a battery cooling device for cooling a battery installed in a vehicle. The battery cooling device takes air from a passenger compartment of the vehicle and blows the air to the battery to cool the battery.

In general, a battery, which supplies electric power to a driving motor for driving an electric vehicle, a hybrid vehicle or the like, is arranged adjacent to a rear seat located at a rear side of the vehicle. Thus, an air intake opening of the battery cooling device is also provided at the rear side of the vehicle, for example, at a rear tray or beneath the rear seat as described in the above patent publication.

Although the temperature of discharged air, which is discharged from an air-conditioning system of the vehicle to the passenger compartment, varies depending on various air-conditioning factors, such as a target air temperature of the passenger compartment, the current air temperature of the passenger compartment and the like, the temperature of the discharged air is normally controlled and adjusted to about 25 degrees Celsius. However, when the air intake opening of the battery cooling device is arranged at the vehicle rear side, for example, at the rear tray or beneath the rear seat, the temperature of the air taken through the air intake opening may be increased to about 30–31 degrees Celsius due to environmental factors, such as irradiation of sunlight, heat of an exhaust pipe of the vehicle, or the like.

As a result, it is difficult to sufficiently cool the battery, and thus the amount of air supplied to the battery needs to be increased to achieve a sufficient cooling capacity for cooling the battery. Consequently, the air blowing noises may be disadvantageously increased, and a service life of the blower may be disadvantageously decreased.

Furthermore, when a heat radiating surface area of the battery, i.e., an outer surface area of the battery, is increased to achieve the sufficient cooling capacity, a size of the battery may be disadvantageously increased, and/or a manufacturing cost may be disadvantageously increased.

SUMMARY OF THE INVENTION

The present invention addresses the above disadvantages. Thus, it is an objective of the present invention to provide a battery temperature control device, which is different from the previously proposed one. It is another objective of the present invention to address at least one of the above disadvantages.

To address the objectives of the present invention, there is provided a battery temperature control device for controlling the temperature of a battery installed in a vehicle. The battery temperature control device includes a rear air-conditioning unit and an air passage. The rear air-conditioning unit is arranged at a rear side of the vehicle and includes an air temperature adjusting means for adjusting the temperature of air discharged from the rear air-conditioning unit into a passenger compartment of the vehicle. The air passage conducts air from a downstream side of the air temperature adjusting means to the battery, so that the air that has passed through the air temperature adjusting means is supplied to the battery to control the temperature of the battery.

To achieve the objectives of the present invention, there is provided a battery temperature control device for controlling the temperature of a battery installed in a vehicle. The battery temperature control device includes an air passage, an air cooling means for cooling air and a mode setting means for selecting one of an outside air aided cooling mode, an inside air aided cooling mode and a cooling means aided cooling mode. The air passage includes an outside air intake opening and an inside air intake opening and receives the battery therein. The air cooling means is located in the air passage on an upstream side of the battery. The outside air aided cooling mode is for cooling the battery by outside air, which is taken from outside the passenger compartment through the outside air intake opening of the air passage. The inside air aided cooling mode is for cooling the battery by inside air, which is taken from inside the passenger compartment through the inside air intake opening of the air passage. The cooling means aided cooling mode is for cooling the battery by air, which is cooled by the air cooling means.

To achieve the objective of the present invention, there is also provided a battery temperature control device for controlling the temperature of a battery installed in a vehicle. The battery temperature control device includes an air passage, an air cooling means for cooling air and a mode setting means for selecting one of a cooling means aided cooling mode and a simple air aided cooling mode. The air passage receives the battery therein. The air cooling means is located in the air passage on an upstream side of the battery. The cooling means aided cooling mode is for cooling the battery by air, which is cooled by the air cooling means. The simple air aided cooling mode is for cooling the battery by air, which is not cooled by the air cooling means.

To achieve the objectives of the present invention, there is also provided a battery temperature control device for controlling the temperature of a battery installed in a vehicle. The battery temperature control device includes an air passage, an air cooling means for cooling air and a mode setting means for selecting one of an outside air aided cooling mode and a cooling means aided cooling mode. The air passage includes an outside air intake opening and receives the battery therein. The air cooling means is located in the air passage on an upstream side of the battery. The outside air aided cooling mode is for cooling the battery by outside air, which is taken from outside a passenger compartment of the vehicle through the outside air intake opening of the air passage. The cooling means aided cooling mode is for cooling the battery by air, which is cooled by the air cooling means.

To achieve the objectives of the present invention, there is provided a battery temperature control device for controlling the temperature of a battery installed in a vehicle. The battery temperature control device includes an air-conditioning unit and an air passage. The air-conditioning unit includes an air cooling means for cooling air to be discharged from the air-conditioning unit into a passenger compartment of the vehicle and an air heating means for heating air to be discharged from the air-conditioning unit into the passenger compartment. The air heating means is arranged on a downstream side of the air cooling means. The air passage conducts air from the air-conditioning unit to the battery. The air passage is connected to the air-conditioning unit at a point, which is located on a downstream side of the air cooling means and also on an upstream side of the air heating means.

To achieve the objectives of the present invention, there is provided a battery temperature control device for controlling the temperature of a battery installed in a vehicle. The battery temperature control device includes a rear air-conditioning unit, a first intake port and a second intake port. The rear air-conditioning unit is arranged at a rear side of the vehicle and includes an air cooling means for cooling air to be discharged from the rear air-conditioning unit into a passenger compartment of the vehicle. The first intake port conducts air from a downstream side of the air cooling means to the battery, so that the air, which has passed through the air cooling means, is supplied to the battery. The second intake port conducts air from an upstream side of the air cooling means to the battery, so that the air, which is not passed through the air cooling means, is supplied to the battery. At least one of the first intake port and the second intake port is at least partially opened to supply the corresponding air to the battery to control the temperature of the battery.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION (First Embodiment)

Figure 1:
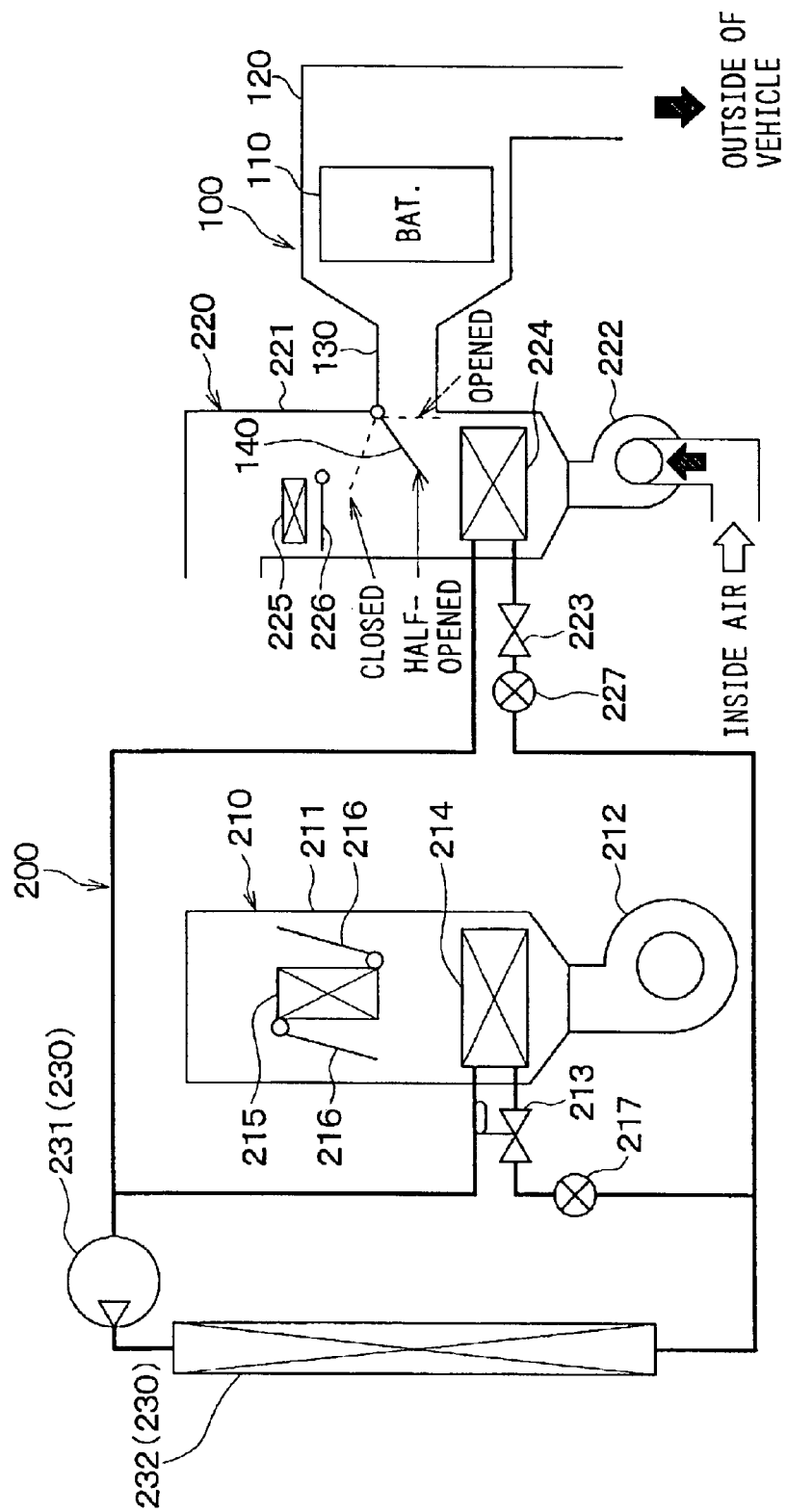
FIG. 1 is a schematic view showing a battery temperature control device according to a first embodiment of the present invention.

In a first embodiment, the present invention is implemented as a battery temperature control device of a vehicle, which includes a vehicle driving electric motor for driving the vehicle and an internal combustion engine. FIG. 1 schematically shows a battery cooling device (serving as a temperature control device) 100 and a vehicle air-conditioning system 200. A battery 110 is a rechargeable secondary battery and is installed in a trunk compartment side of the vehicle, which is located adjacent to a rear seat and serves as a rear side of the vehicle.

The present embodiment will be described with reference to the air-conditioning system 200 and then with reference to the battery temperature control device (hereinafter simply referred to as a temperature control device) 100.

The air-conditioning system 200 includes a front air-conditioning unit (hereinafter simply referred to as a front unit) 210, a rear air-conditioning unit (hereinafter simply referred to as a rear unit) 220 and external units 230, such as a compressor 231, a condenser 232 and the like. The front unit 210 mainly carries out air-conditioning of a front seat side of the vehicle, and the rear unit 220 mainly carries out air-conditioning of a rear seat side of the vehicle.

The compressor 231 is driven by an electric motor, which is different from the vehicle driving electric motor, to take and compress refrigerant. The condenser 232 allows heat exchange between the discharged refrigerant, which is discharged from the compressor 231, and the outside air, which is taken from outside of the vehicle, to cool and condense the refrigerant.

The front unit 210 includes a first air-conditioning casing 211, a first blower 212, a first evaporator 214, a first heater core 215 and a first air mix door 216. The first air-conditioning casing 211 forms an air passage, through which the air is discharged to the front seat side. The first blower 212 blows the air toward the front seat side. The first evaporator 214 evaporates the refrigerant through heat exchange between the decompressed refrigerant, which is decompressed or depressurized by a first decompressor 213, and the air to be discharged to the front seat side. The first heater core 215 heats the air to be discharged to the front seat side using the heat of the engine coolant as a heat source. The first air mix door 216 adjusts the amount of air flow, which passes through the first heater core 215.

The first decompressor 213 in this embodiment is a thermostat expansion valve, which adjusts its valve position or its degree of opening to keep a predetermined temperature of the refrigerant at the refrigerant outlet side of the first evaporator 214. The first electromagnetic valve 217 opens and closes a refrigerant passage, which conducts the refrigerant to the first evaporator 214.

The rear unit 220 includes a second air-conditioning casing 221, a second blower 222, a second evaporator (serving as an air temperature adjusting means) 224, a second heater core 225 and a second air mix door 226. The second air-conditioning casing 221 forms an air passage, through which the air is discharged to the rear seat side. The second blower 222 blows air toward the rear seat side. The second evaporator 224 evaporates the refrigerant through heat exchange between the decompressed refrigerant, which is decompressed or depressurized by a second decompressor 223, and the air to be discharged to the rear seat side. The second heater core 225 heats the air to be discharged to the rear seat side using the heat of the engine coolant as a heat source. The second air mix door 226 adjusts the amount of air flow, which passes through the second heater core 225.

Similar to the first decompressor 213, the second decompressor 223 is a thermostat expansion valve, which adjusts its valve position or its degree of opening to keep a predetermined temperature of the refrigerant at the refrigerant outlet side of the second evaporator 224. The second electromagnetic valve 227 opens and closes a refrigerant passage, which conducts the refrigerant to the second evaporator 224.

In the air-conditioning system 200 of the present embodiment, the front unit 210 can select one of an outside air intake mode and an inside air circulation mode. In the outside air intake mode, the front unit 210 takes the outside air from outside of the passenger compartment and discharges the outside air to the passenger compartment. In the inside air circulation mode, the front unit 210 takes the inside air from the passenger compartment and discharges the inside air to the passenger compartment. However, the rear unit 220 can only perform the inside air circulation mode.

In addition to the rear unit 220, the temperature control device 100 includes a battery casing 120, a duct 130 and a closure door (serving as a battery directed air flow adjusting means) 140. The battery casing 120 receives the battery 110 and forms an air passage, through which the air is supplied to the battery 110. The duct 130 connects between an upstream side of the air flow in the battery casing 120 and the second air-conditioning casing 221 to conduct the air, which has passed through the second evaporator 224, to the battery 110, i.e., to the battery casing 120. The duct 130 and the battery casing 120 serve as an air passage, which conducts air from a downstream side of the second evaporator 224 to the battery 110. The closure door 140 is provided at a connection between the second air-conditioning casing 221 and the duct 130 and adjusts a ratio between the amount of air flow, which has passed through the second evaporator 224 and is supplied to the duct 130 and the amount of air flow, which has passed through the second evaporator 224 and is supplied to the second heater core 225.

Here, closing of the closure door 140 (i.e., a degree of opening of the closure door 140 is zero) refers to a state where all of the air, which has passed through the second evaporator 224, is supplied to the duct 130. As the degree of opening of the closure door 140 increases, the amount of air flow, which is supplied to the duct 130, decreases, and thus the amount of air flow, which is supplied to the duct 130, decreases, and thus the amount of air flow, which is supplied to the heater core 225 increases.

In the battery casing 120, a downstream side of the air flow is communicated with the inside or outside of the passenger compartment (in the present embodiment, the downstream side of the air flow is communicated with the outside of the passenger compartment, i.e., the outside of the vehicle).

Figure 2:
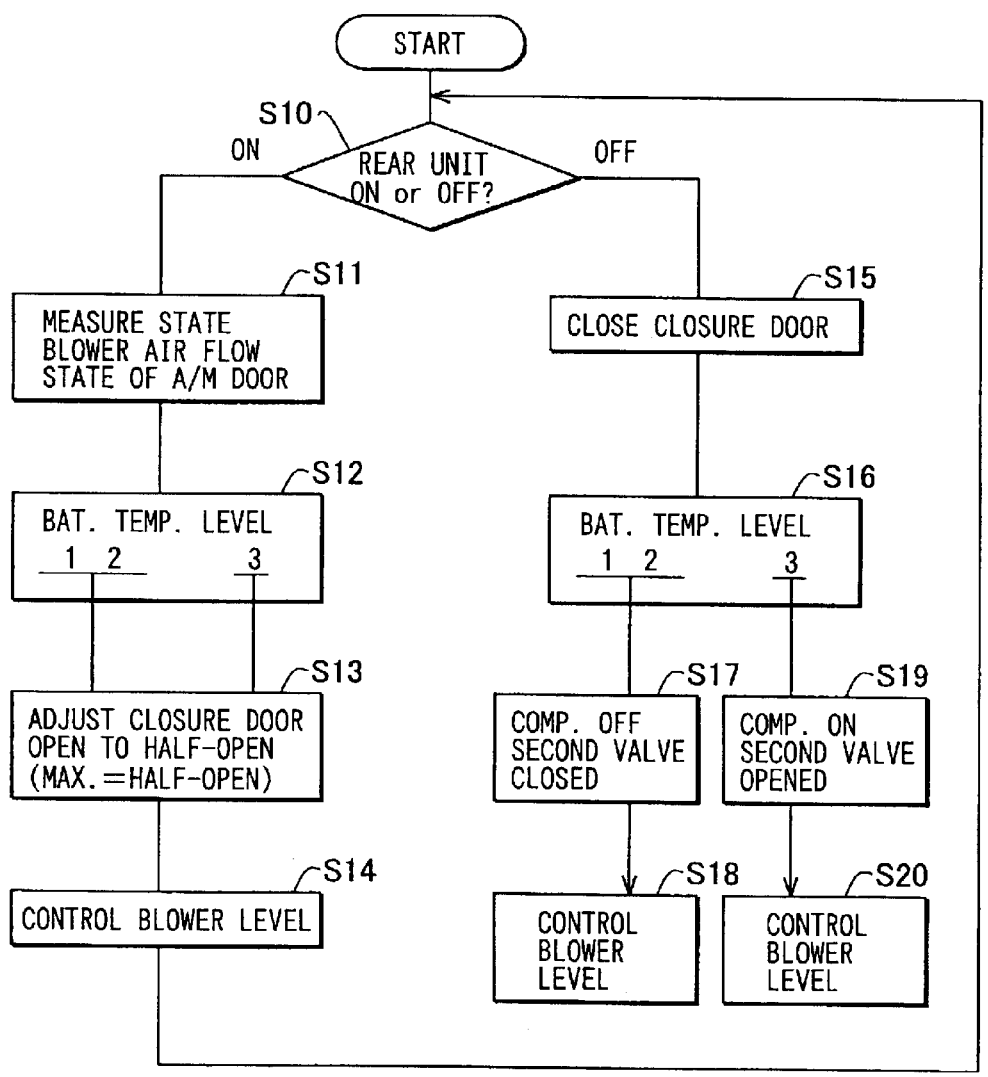
FIG. 2 is a flow chart showing a control flow of the battery temperature control device according to the first embodiment.

Next, control operation of the temperature control device 100 will be described with reference to a flow chart shown in FIG. 2.

When an ignition switch (not shown) is turned on, it is determined whether the rear unit 220 is currently operating at S10. When it is determined that the rear unit 220 is operating, a parameter, such as the amount of air flow at the second blower 222 or the degree of opening of the second air mix (AIM) door 226, which indicates an operational state of the rear unit 220, is measured at S11. In the present embodiment, the rear unit 220 is determined to be operating only when the compressor 231 is operating, and the second electromagnetic valve 227 is opened.

Then, a temperature of the battery 110 is measured, and a battery temperature level is determined at S12. Here, a level 3 of the battery temperature refers to a state where the battery temperature is relatively high. A level 1 of the battery temperature refers to a state where the battery temperature is relatively low. A level 2 of the battery temperature refers to a state where the battery temperature is intermediate between the level 1 and the level 3.

Figure 3:
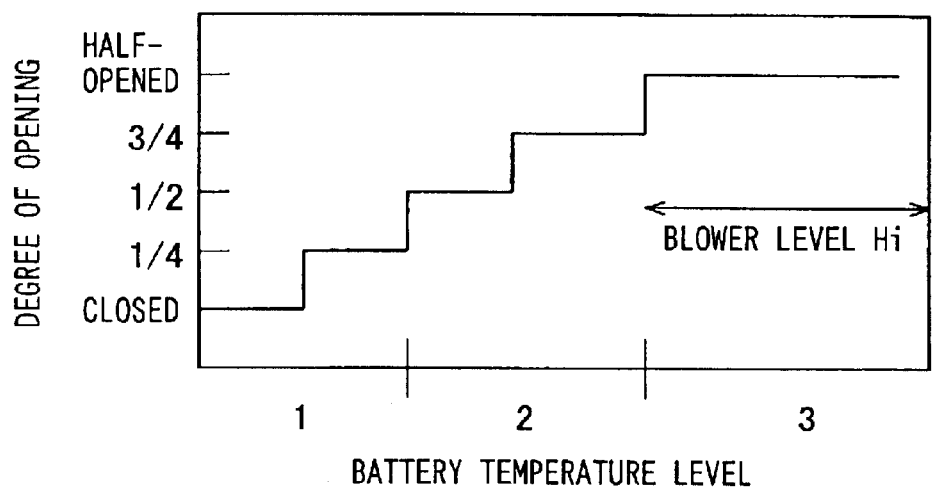
FIG. 3 is a diagram showing a relationship between a battery temperature level and a degree of opening of a closure door in the battery temperature control device according to the first embodiment.

As shown in FIG. 3, a degree of opening of the closure door 140 is adjusted between a fully opened sate and a half-opened state based on the battery temperature level determined at S12 to control the amount of air flow supplied to the battery 110 while maintaining the air-conditioning function to discharge the conditioning air to the rear seats at S13.

When the degree of opening of the closure door 140 changes, the amount and temperature of the conditioning air to be discharged to the rear seats change. Because of this fact, at S14, the second blower 222 and the second air mix door 226 are controlled and adjusted such that the amount and temperature of the conditioning air to be discharged to the rear seats correspond to the amount and temperature of the conditioning air measured at S11 during the operation of the rear unit 220. However, when the battery temperature level is in the level 3, the second blower 222 is operated at its maximum level to provide the maximum amount of air flow to achieve a sufficient cooling level of the battery 110.

On the other hand, when it is determined that the rear unit 220 is stopped at S10, the closure door 140 is fully closed to supply all of the air, which has passed through the second evaporator 224, to the battery 110 at S15, and the battery temperature level is determined at S16.

Figure 4:
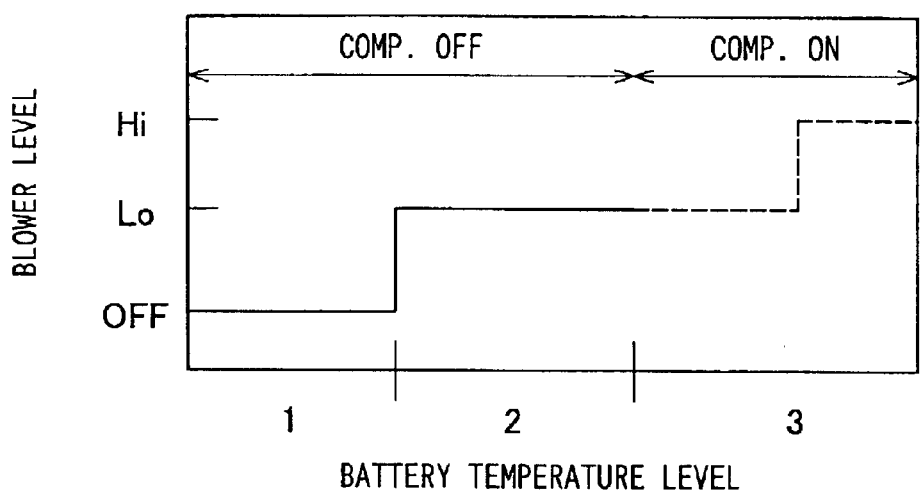
FIG. 4 is a diagram showing a relationship between a battery temperature level and a blower level in the battery temperature control device according the first embodiment.

Then, when it is determined that the battery temperature level is equal to or less than the level 2, it is assumed that the battery 110 can be effectively cooled by simply blowing the air to the battery 110, so that the compressor 231 is stopped, and the second electromagnetic valve 227 is closed at S17. Then, the second blower 222 is operated such that the amount of air flow is increased as the battery temperature level is increased, as shown in FIG. 4, at S18.

When it is determined that the battery temperature level is in the level 3 at S16, it is assumed that the battery 110 cannot be effectively cooled by simply blowing the air to the battery 110, so that the compressor 231 is operated, and the second electromagnetic valve 227 is opened at S19. Then, the second blower 222 is operated such that the amount of air flow is increased as the battery temperature level is increased, as shown in FIG. 4, at S20.

Advantages of the first embodiment will be described.

According to the first embodiment, the air for adjusting the temperature of the battery 110 is supplied from the rear unit 220, which is closer to the battery 110 in comparison to the front unit 210, to the battery 110 through the duct 130. Thus, in comparison to the case where the inside air is taken from the passenger compartment and is discharged to the battery 110, the temperature of the air that is blown to the battery 110 can be advantageously reduced.

Thus, according to the first embodiment, the battery 110 can be sufficiently cooled, so that it is not necessary to increase the amount of air flow to be discharged to the battery 110 to achieve the sufficient cooling capacity for cooling the battery 110. As a result, it is possible to reduce the air blowing noises and to increase the service life of the second blower 222.

Furthermore, since sufficient cooling capacity can be achieved according to the first embodiment, it is not required to increase a heat radiating surface area of the battery 110. As a result, an increase in the size of the battery 110 and an increase in the manufacturing cost can be avoided.

Also, when the battery temperature level is in the level 3, the compressor 231 is operated regardless of an air-conditioning heat load in the passenger compartment to cool the air through the second evaporator 224, and the cooled air is supplied to the battery 110. Thus, the battery 110 can be more effectively cooled.

When the battery temperature level is less than the level 3, the second evaporator 224, the second air mix door 226 and the second blower 222 are operated based on the air-conditioning heat load, and the degree of opening of the closure door 140 is adjusted to adjust the amount of air flow supplied to the battery 110 to control the temperature of the battery 110. Thus, the temperature of the battery 110 can be controlled while maintaining the air-conditioning function.

(Second Embodiment)

Figure 5:
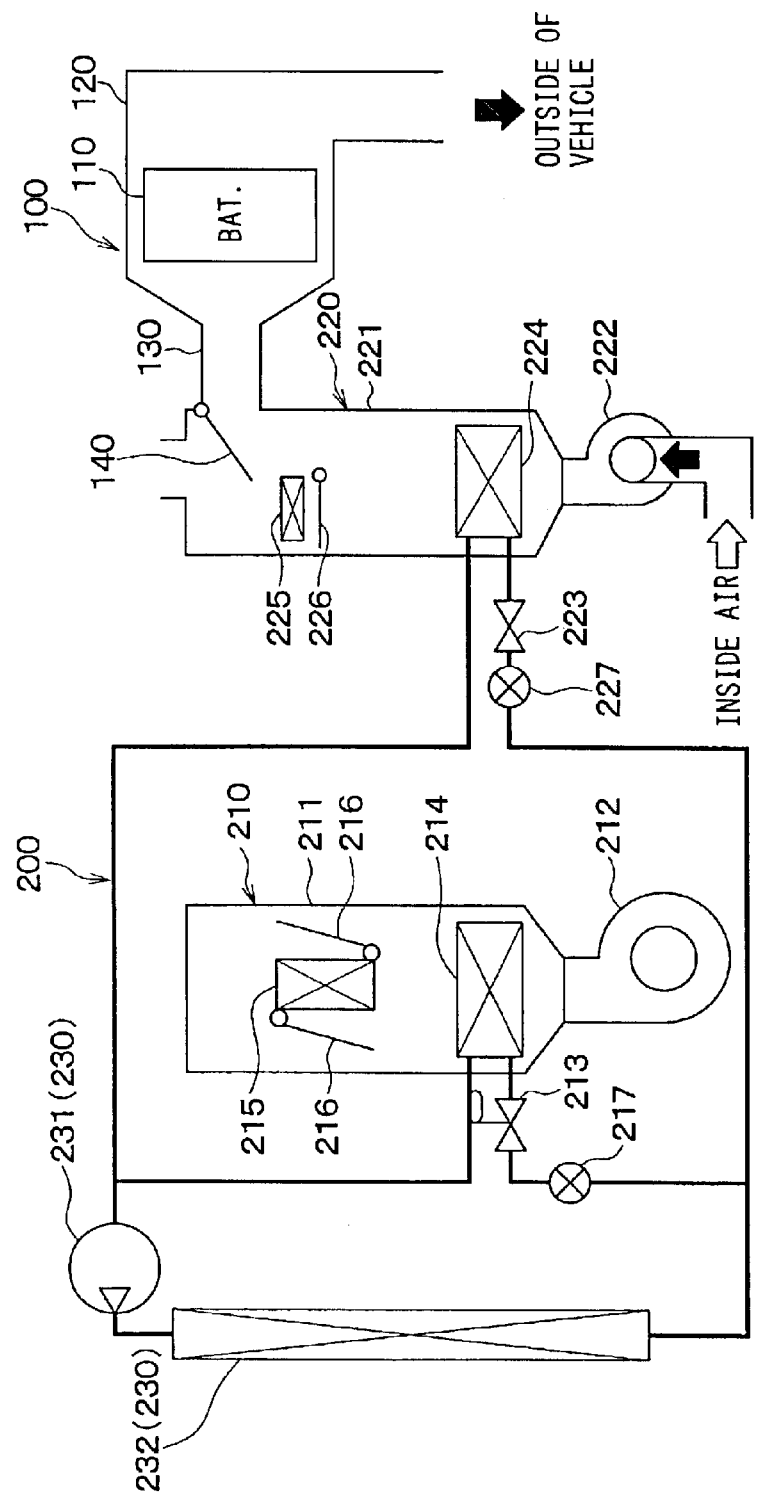
FIG. 5 is a schematic view showing a battery temperature control device according to a second embodiment of the present invention.

In the first embodiment, the duct 130 is connected to the second air-conditioning casing 221 at the point, which is located on the downstream side of the second evaporator 224 and on the upstream side of the second heater core 225, to conduct the cold air, which is taken before mixing of the cold air and the warm air takes place, to the duct 130. However, in a second embodiment, as shown in FIG. 5, the duct 130 is connected to the second air-conditioning casing 221 at the downstream side of the second heater core 225 (serving as an air temperature adjusting means) to conduct the air, which is taken after mixing of the cold air and the warm air takes place.

In this way, at cold temperatures, for example, during the winter season, the battery 110 can be heated by the warm air supplied through the duct 130, so that the temperature of the battery 110 can be effectively adjusted to the appropriate temperature (e.g., about 40 degrees Celsius).

(Third Embodiment)

Figure 6:
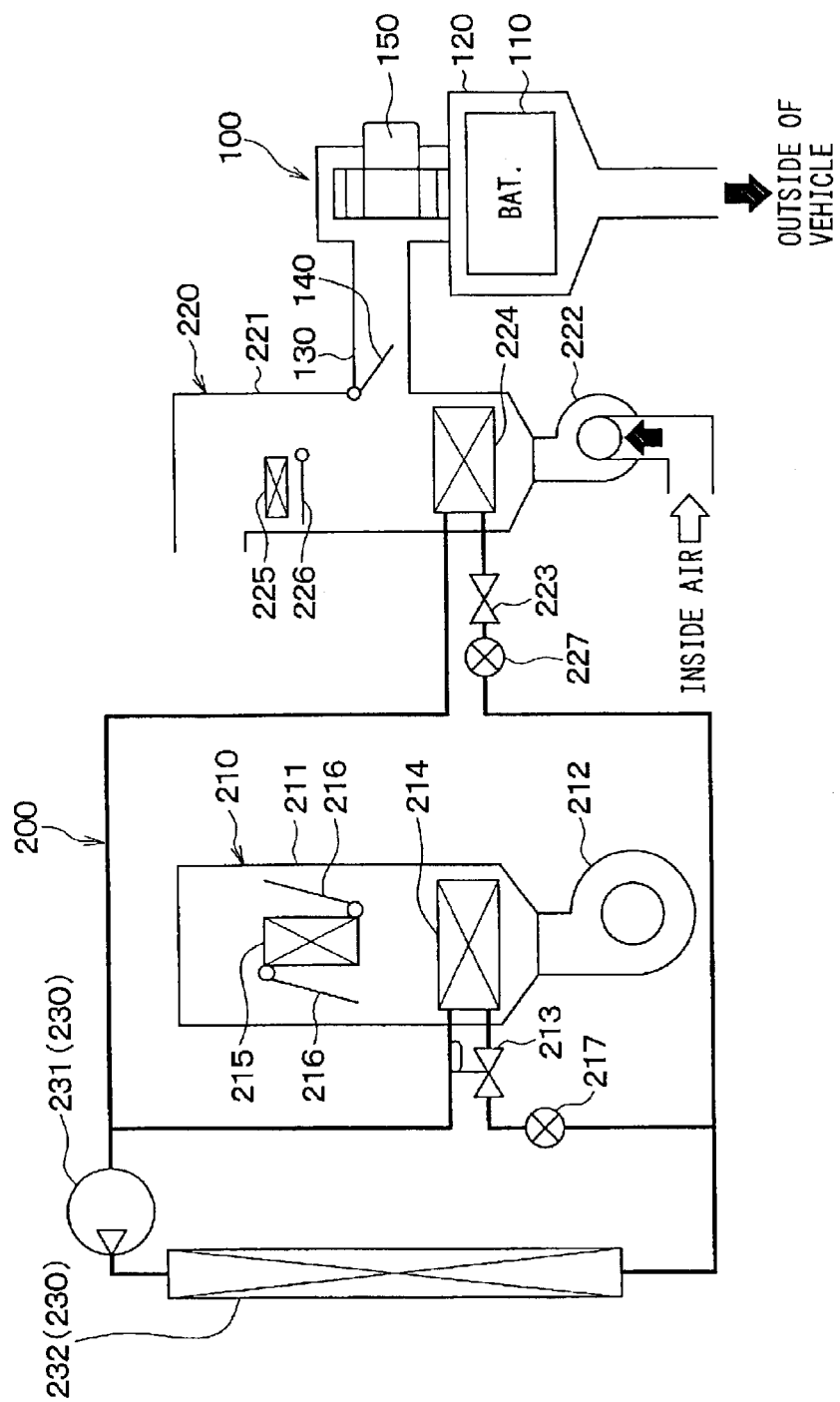
FIG. 6 is a schematic view showing a battery temperature control device according to a third embodiment of the present invention.

In the above embodiments, the amount of air flow supplied to the battery 110 is mainly adjusted by the closure door 140. However, in a third embodiment, as shown in FIG. 6, a dedicated blower (serving as a battery directed air flow adjusting means) 150, which is dedicated to the temperature control device 100, is provided. In the third embodiment, the closure door 140 is used mainly to open and close the duct 130.

Even when the dedicated blower 150 is provided, the temperature of the air that is blown to the battery 110 can be effectively reduced like in the above embodiments.

As a result, the battery 110 can be sufficiently cooled, and thus it is not required to increase the amount of air flow supplied to the battery 110 to achieve the sufficient cooling capacity. Therefore, the air blowing noises can be reduced, and a reduction in a service life of the blower 150 can be avoided.

(Fourth Embodiment)

Figure 7:
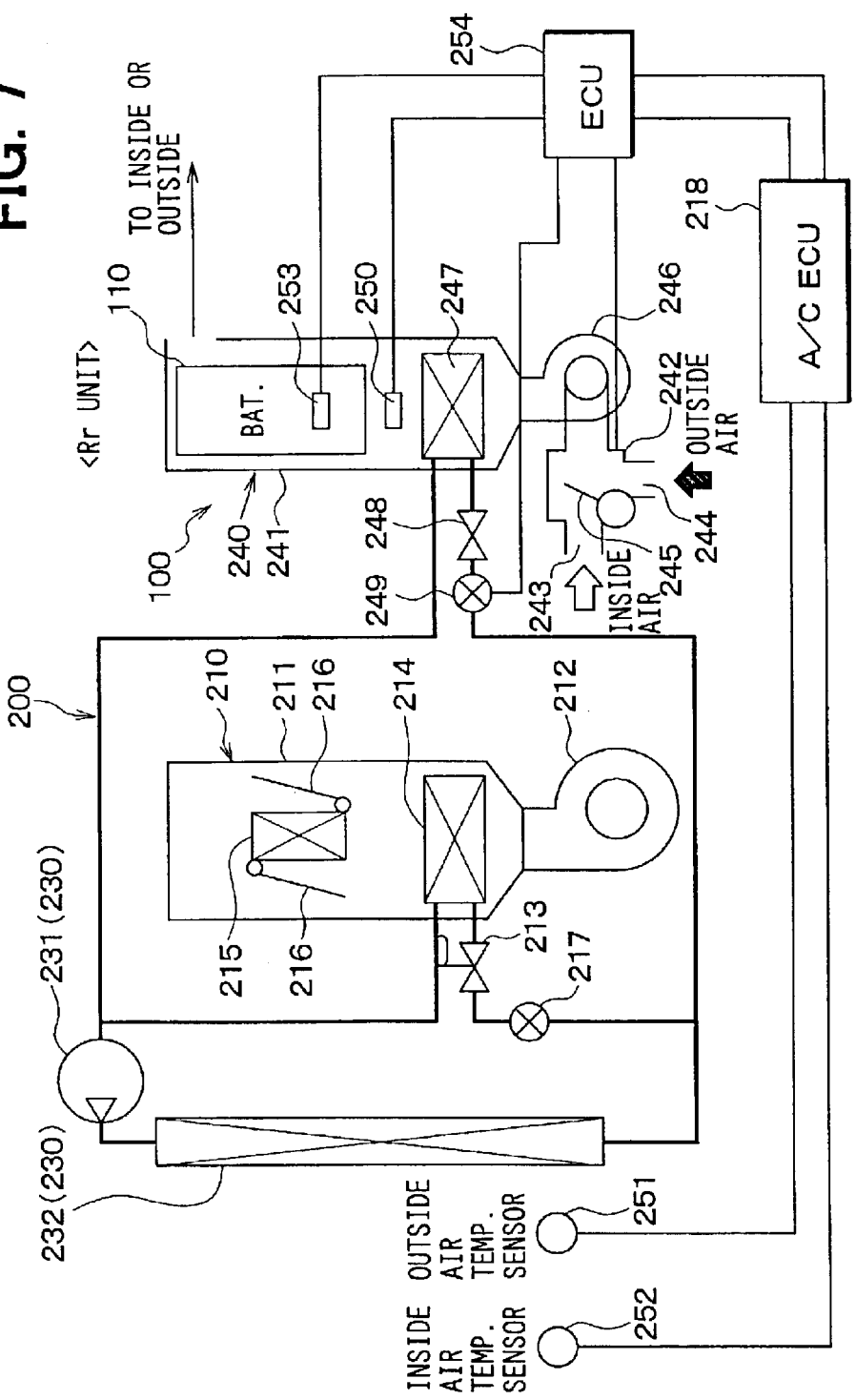
FIG. 7 is a schematic view showing a battery temperature control device according to a fourth embodiment of the present invention.

In the above embodiments, the battery 110 is cooled through use of the rear unit 220. In a fourth embodiment as well as fifth and sixth embodiments described below, a dedicated cooling unit 240, which is dedicated for cooling the battery 110, is provided, as shown in FIG. 7. The cooling unit 240 is installed in a trunk compartment side of the vehicle, which is located adjacent to the rear seats and serves as a vehicle rear side.

The fourth embodiment will be described while focusing on differences between the above embodiments and the fourth embodiment.

A casing 241 receives the battery 110 and forms an air passage, through which the air for cooling the battery 110 flows. At the upstream end of the air flow in the casing 241, there is provided an air supply source switching device 242 for switching a source of the air to be supplied into the casing 241 between the inside air and the outside air.

The air supply source switching device 242 includes an inside air intake opening 243, an outside air intake opening 244 and a switching door 245. The switching door 245 opens and closes each of the inside air intake opening 243 and the outside air intake opening 244. Furthermore, the switching door 245 is driven by a drive means, such as a servo motor.

A centrifugal blower 246 is arranged on a downstream side of the air supply source switching device 242. In the casing 241, an evaporator (serving as an air cooling means) 247 is arranged on a downstream side of the blower 246. The evaporator 247 serves as a low pressure side heat exchanger of a vapor compression refrigeration system and cools the air that is blown to the battery 110. The air supply source switching device 242, the centrifugal blower 246 and the casing 241 cooperatively serve as an air passage, and the inside air intake opening 243 and the outside air intake opening 244 of the air supply source switching device 242 serve as an inside air intake opening and an outside air intake opening, respectively, of the air passage.

As is known in the art, in the vapor compression refrigeration system, a low pressure refrigerant is depressurized by a decompressor 248, such as an expansion valve or a capillary tube, and absorbs heat, and then the vaporized refrigerant is compressed to provide the refrigerant of the high temperature and the high pressure and is then condensed to release heat. In the present embodiment, the compressor 231 and the condenser 232 of the front unit 210 are used for this purpose. An electromagnetic valve 249 is a valve that enables or disenables supply of the refrigerant, which is circulated in the front unit 210, to the decompressor 248.

A cooling air temperature sensor 250 serves as a temperature measuring means for measuring a temperature of the cooling air and is positioned on a downstream side of the evaporator 247. An outside air temperature sensor 251 serves as a temperature measuring means for measuring a temperature of the outside air. An inside air temperature sensor 252 serves as a temperature measuring means for measuring a temperature of the inside air. A battery temperature sensor 253 serves as a temperature measuring means for measuring a temperature of the battery 110.

A measured temperature value of the outside air temperature sensor 251 and a measured temperature value of the inside air temperature sensor 252 are supplied to an air-conditioning electronic control unit (ECU) 218 and are used to control the front unit 210. The measured temperature value of the outside air temperature sensor 251 and the measured temperature value of the inside air temperature sensor 252 are also supplied to a cooling unit electronic control unit (ECU) 254 through the air-conditioning electronic control unit 218 and are used to control the cooling unit 240 with reference to a measured temperature value of the cooling air temperature sensor 250 and a measured temperature value of the battery temperature sensor 253.

Figure 8:
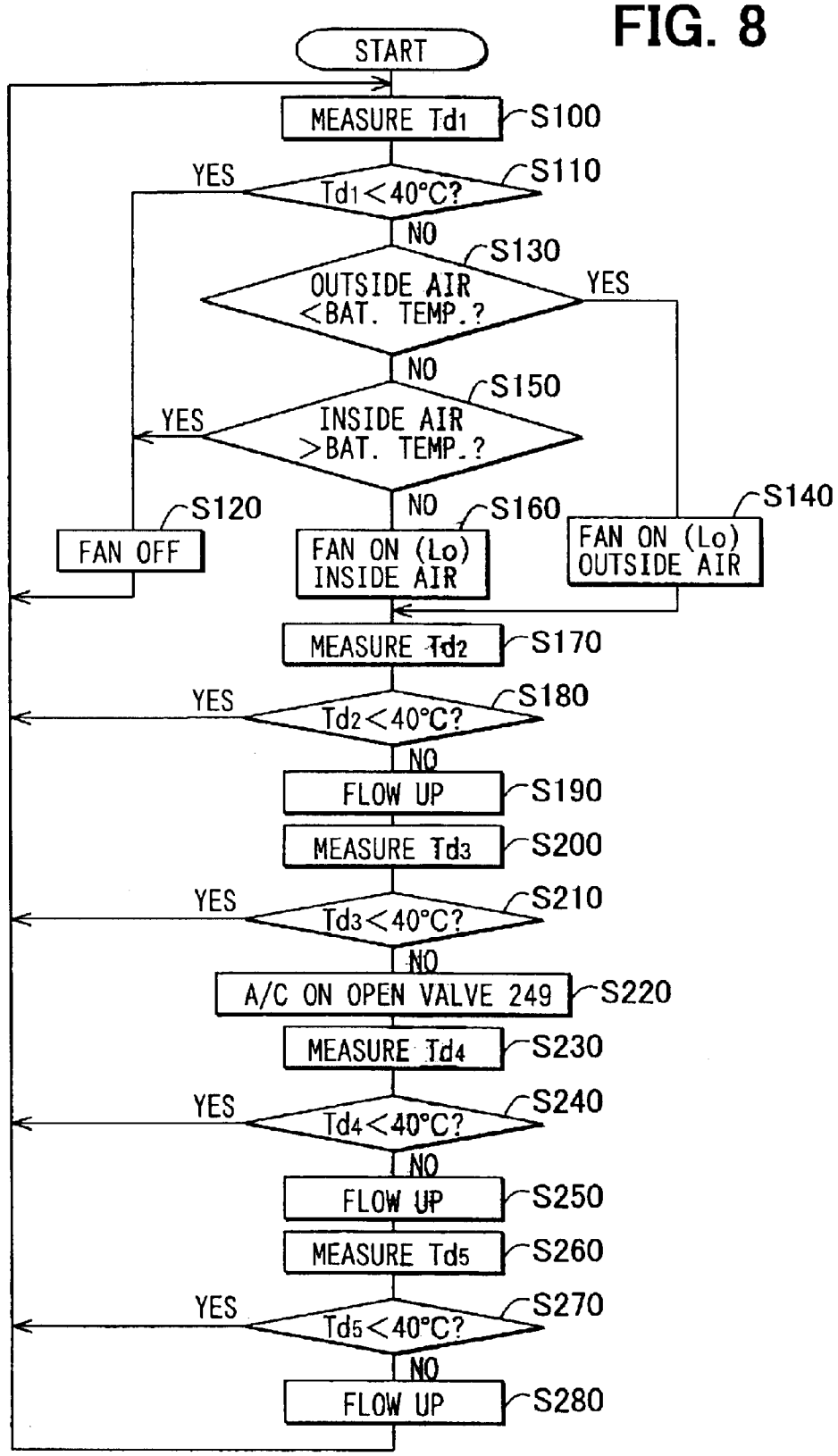
FIG. 8 is a flow chart showing a control flow of the battery temperature control device according to the fourth embodiment.

Operation and advantages of the fourth embodiment will be described with reference to FIG. 8.

In the fourth embodiment, the following cooling modes are provided for cooling the battery 110. Each of the cooling modes will be described before describing a flow chart of FIG. 8.

1. Simple Air Aided Cooling Mode

A simple air aided cooling mode is a cooling mode for cooling the battery 110 by the air that has not been cooled by the vapor compression refrigeration system, i.e., the evaporator 247. Specifically, the simple air aided cooling mode includes the following two modes.

1.1 Outside Air Aided Cooling Mode

An outside air aided cooling mode is a cooling mode for cooling the battery 110 by the outside air that is introduced into the casing 241 from the outside of the vehicle.

1.2 Inside Air Aided Cooling Mode

An inside air aided cooling mode is a cooling mode for cooling the battery 110 by the inside air that is introduced into the casing 241 from the inside or passenger compartment of the vehicle.

2. Refrigeration System Aided Cooling Mode

A refrigeration system aided cooling mode (or a cooling means aided cooling mode) is a cooling mode for cooling the battery 110 by the air that has been cooled by the vapor compression refrigeration system, i.e., the evaporator 247.

A control flow will be described with reference to FIG. 8.

When the ignition switch (main power switch) is turned on, it is determined whether a battery temperature Td1 is less than a predetermined temperature (e.g., 40 degrees Celsius) at S110. When it is determined that the battery temperature Td1 is less than the predetermined temperature, it is assumed that the battery 110 does not need to be cooled, and thus the blower 246 is stopped at S120.

On the other hand, when it is determined that the battery temperature Td1 is equal to or greater than the predetermined temperature, the battery temperature Td1 is compared with a temperature of the outside air (i.e., the measured temperature of the outside air temperature sensor 251) to see whether the battery cooling under the outside air aided cooling mode is possible at S130. Here, the step S130 serves as a first determining means. When it is determined that the temperature of the outside air is less than the battery temperature Td1, the battery 110 can be cooled under the outside air aided cooling mode, so that the amount of air flow at the blower 246 is set to the minimum amount (Lo), and the battery 110 is cooled under the outside air aided cooling mode at S140.

When it is determined that the temperature of the outside air is equal to or greater than the battery temperature Td1 at S130, the battery 110 cannot be cooled under the outside air aided cooling mode, so that the battery temperature Td1 is compared with the temperature of the inside air (i.e., the measured temperature of the inside air temperature sensor 252) to see whether the battery cooling under the inside air aided cooling mode is possible at S150. Here, the step S150 serves as a second determining means. When it is determined that the temperature of the inside air is equal to or less than the battery temperature Td1, the battery cooling under the inside air aided cooling mode is possible, so that the amount of air flow generated by the blower 246 is set to the minimum amount (Lo), and the battery 110 is cooled under the inside air aided cooling mode at S160.

On the other hand, when it is determined that the temperature of the inside air is equal to or greater than the battery temperature Td1 at S150, the battery 110 cannot be cooled under the inside air aided cooling mode. Thus, the blower 246 is stopped, and control returns to S100.

Furthermore, when it is determined that the temperature of the inside air is greater than the battery temperature Td1 at S150, it is possible to cool the battery 110 under the refrigeration system aided cooling mode. However, when the temperature of the inside air is equal to or greater than 40 degrees Celsius (battery temperature Td), the user normally turns on the front unit 210, i.e., the air-conditioning system.

Thus, even when the battery 110 is not cooled under the refrigeration system aided cooling mode, the temperature of the inside air becomes less than the battery temperature Td1 at the next comparison of the battery temperature Td1 with the temperature of the inside air, so that the inside air aided cooling mode is selected. Thus, even when the temperature of the inside air is greater than the battery temperature Td1, and thus control returns to S100, there is no substantial practical problem.

When the simple air aided cooling mode, i.e., the outside air aided cooling mode or the inside air aided cooling mode is selected at S140 or S160, a temperature of the battery 110 is measured once again at S170. Then, it is determined whether the measured battery temperature Td2 is less than a predetermined temperature (e.g., 40 degrees Celsius) at S180. When it is determined that the battery temperature Td2 is less than the predetermined temperature, control returns to S100. On the other hand, when it is determined that the battery temperature Td2 is equal to or greater than the predetermined temperature, the current cooling mode is maintained, and the amount of air flow generated by the blower 246 is increased to an intermediate amount (Me) that is greater than the minimum amount and is less than the maximum amount at S190.

Next, a temperature of the battery 110 is measured once again at S200. Then, it is determined whether the measured battery temperature Td3 is less than a predetermined temperature (e.g., 40 degrees Celsius) at S210. When it is determined that the battery temperature Td3 is less than the predetermined temperature, control returns to S100. On the other hand, when it is determined that the battery temperature Td3 is equal to or greater than the predetermined temperature, the battery 110 is cooled under the refrigeration system aided cooling mode while the amount of air flow is kept at the minimum amount at S220.

Next, a temperature of the battery 110 is measured once again at S230. Then, it is determined whether the measured battery temperature Td4 is less than a predetermined temperature (e.g., 40 degrees Celsius) at S240. When it is determined that the measured battery temperature Td4 is less than the predetermined temperature, control returns to S100. On the other hand, when it is determined that the battery temperature Td4 is equal to or greater than the predetermined temperature, the amount of air flow generated by the blower 246 is increased to the intermediate amount (Me) that is greater than the minimum amount and is less than the maximum amount at S250.

Next, a temperature of the battery 110 is measured once again at S260. Then, it is determined whether the measured battery temperature Td5 is less than a predetermined temperature (e.g., 40 degrees Celsius) at S270. When it is determined that the battery temperature Td5 is less than the predetermined temperature, control returns to S100. On the other hand, when it is determined that the battery temperature Td5 is equal to or greater than the predetermined temperature, the amount of air flow generated by the blower 246 is increased to the maximum amount (Hi) at S280. The above described steps S100 to S280 serve as a mode setting means.

Advantages of the fourth embodiment will be described.

The battery 110 is cooled through selection of one of the outside air aided cooling mode, the inside air aided cooling mode and the refrigeration system aided cooling mode. Thus, when the temperature of the outside air and the temperature of the inside air are both relatively low, for example, during the spring or fall, the battery 110 can be cooled without operating the compressor 231.

Thus, the battery 110 can be effectively cooled while the power consumption for cooling the battery 110 is reduced, and an operating rate of the blower 246 and/or the compressor 231 is reduced to reduce the air blowing noises.

Furthermore, when the temperature of the outside air is relatively low, the battery 110 is cooled by the outside air. Thus, at the time of cooling the battery 110, an increase in the amount of air flow introduced into the passenger compartment can be avoided. As a result, an increase in the load of the front unit 210, i.e., an increase in the air conditioning load can be avoided. Therefore, the battery 110 can be effectively cooled without sacrificing the air-conditioning capacity.

Furthermore, when it is not required to actively cool the battery 110, for example, during the winter, the blower 246 is stopped, or the amount of air flow generated by the blower 246 is minimized. Thus, the battery 110 can be effectively cooled while avoiding an increase in the power consumption of the blower 246.

Also, the amount of air flow is progressively increased, so that the battery 110 can be effectively cooled while avoiding an increase in the power consumption of the blower 246.

As described above, according to the fourth embodiment, the battery 110 can be effectively cooled while a fuel consumption of the vehicle is improved.

(Fifth Embodiment)

Figure 9:
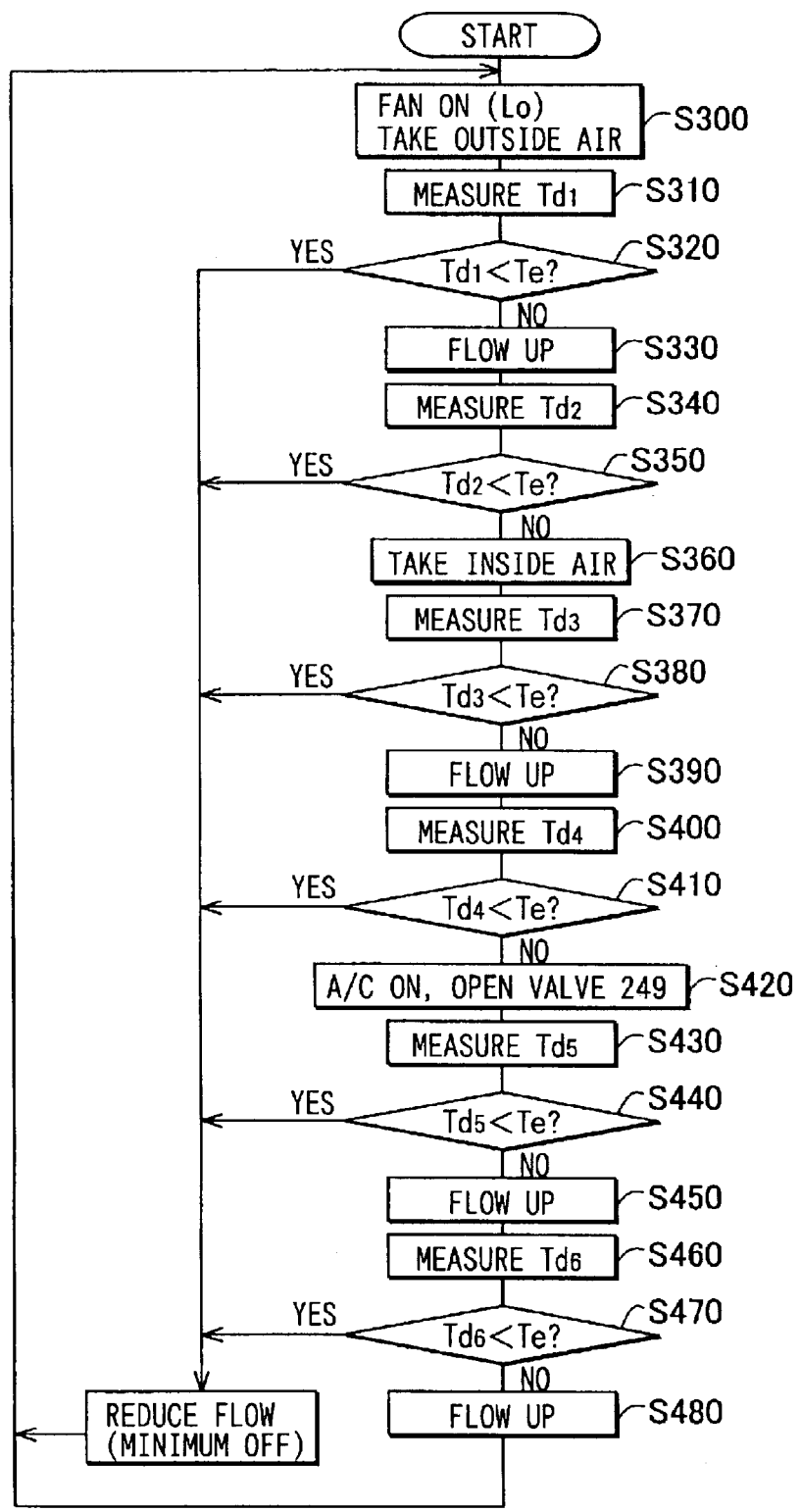
FIG. 9 is a flow chart showing a control flow of a battery temperature control device according to a fifth embodiment of the present invention.

A fifth embodiment of the present invention is similar to the fourth embodiment except that the control flow in the temperature control device 100 is changed. The control flow according to the fifth embodiment will be described with reference to FIG. 9

When the ignition switch is turned on, the amount of air flow generated by the blower 246 is maintained at the minimum amount, and the battery 110 is cooled under the outside air aided cooling mode at S300.

Next, a temperature of the battery 110 is measured at S310. Then, it is determined whether the measured battery temperature Td1 is less than a temperature Te of the intake air (i.e., the temperature measured with the cooling air temperature sensor 250) at S320. When it is determined that the battery temperature Td1 is less than the temperature Te, the amount of air flow generated by the blower 246 is minimized, or the blower 246 is stopped, and control returns to S300. On the other hand, when it is determined that the battery temperature Td1 is equal to or greater than the temperature Te, the current cooling mode is maintained, and the amount of air flow generated by the blower 246 is increased to the intermediate amount (Me) that is greater than the minimum amount and is less than the maximum amount at S330.

Next, a temperature of the battery 110 is measured once again at S340. Then, it is determined whether the measured battery temperature Td2 is less than the temperature Te at S350. When it is determined that the battery temperature Td2 is less than the temperature Te, the amount of air flow generated by the blower 246 is minimized, or the blower 246 is stopped, and control returns to S300. On the other hand, when it is determined that the battery temperature Td2 is equal to or greater than the temperature Te, the amount of air flow is minimized, and the battery 110 is cooled under the inside air aided cooling mode at S360.

Next, a temperature of the battery 110 is measured once again at S370. Then, it is determined whether the measured battery temperature Td3 is less than the temperature Te at S380. When it is determined that the battery temperature Td3 is less than the temperature Te, the amount of air flow generated by the blower 246 is minimized, or the blower 246 is stopped, and control returns to S300. On the other hand, when the battery temperature Td3 is equal to or greater than the temperature Te, the current cooling mode is maintained, and the amount of air flow generated by the blower 246 is increased to the intermediate amount (Me) that is greater than the minimum amount and is less than the maximum amount at S390.

Next, a temperature of the battery 110 is measured once again at S400. Then, it is determined whether the measured battery temperature Td4 is less than the temperature Te at S410. When it is determined that the battery temperature Td4 is less than the temperature Te, the amount of air flow generated by the blower 246 is minimized, or the blower 246 is stopped, and control returns to S300. On the other hand, when it is determined that the battery temperature Td4 is equal to or greater than the temperature Te, the amount of air flow is minimized, and the battery 110 is cooled under the refrigeration system aided cooling mode at S420.

Next, a temperature of the battery 110 is measured once again at S430. Then, it is determined that the measured battery temperature Td5 is less than the temperature Te at S440. When it is determined that the battery temperature Td5 is less than the temperature Te, the amount of air flow generated by the blower 246 is minimized, or the blower 246 is stopped, and control returns to S300. On the other hand, when it is determined that the battery temperature Td5 is equal to or greater than the temperature Te, the amount of air flow generated by the blower 246 is increased to the intermediate amount (Me) that is greater than the minimum amount and is less than the maximum amount at S450.

Next, a temperature of the battery 110 is measure once again at S460. Then, it is determined whether the measured battery temperature Td6 is less than the temperature Te at S470. When it is determined that the battery temperature Td6 is less than the temperature Te, the amount of air flow generated by the blower 246 is minimized, or the blower 246 is stopped, and control returns to S300. On the other hand, when it is determined that the battery temperature Td6 is equal to or greater than the temperature Te, the amount of air flow generated by the blower 246 is increased to the maximum amount (Hi) at S480. The above described steps S300 to S480 serve as a mode setting means.

As described above, in the fifth embodiment, one of the outside air aided cooling mode, the inside air aided cooling mode and the refrigeration system aided cooling mode is selected to cool the battery 110. Thus, similar to the fourth embodiment, the battery 110 can be effectively cooled while the fuel consumption of the vehicle is improved.

Furthermore, the temperature of the air introduced into the casing 241 is measured with the cooling air temperature sensor 250, so that the controlling structure is simpler than that of the fourth embodiment where the outside air temperature sensor 251 and the inside air temperature sensor 252 are used.

(Sixth Embodiment)

Figure 10:
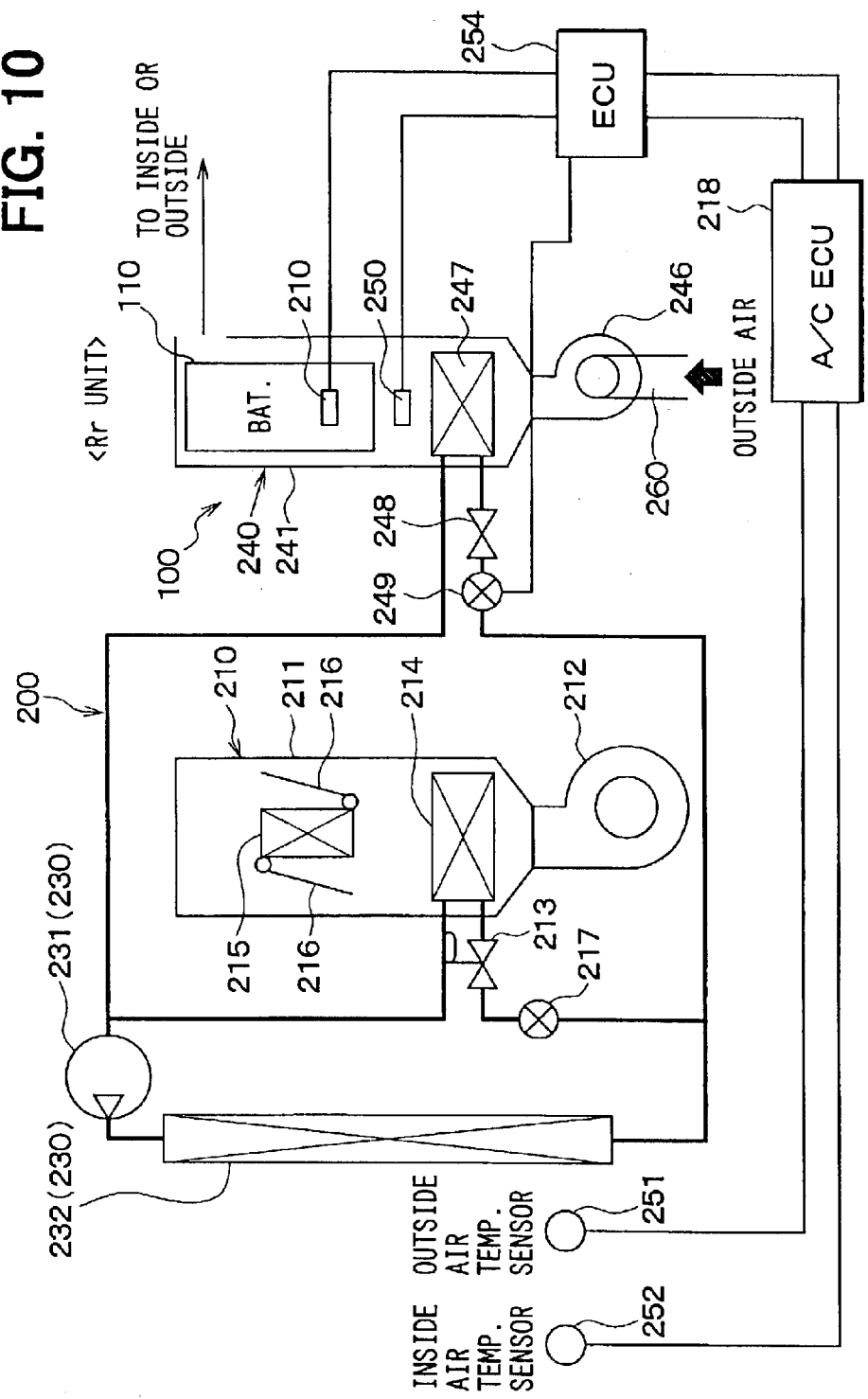
FIG. 10 is a schematic view showing a battery temperature control device according to a sixth embodiment of the present invention.
Figure 11:
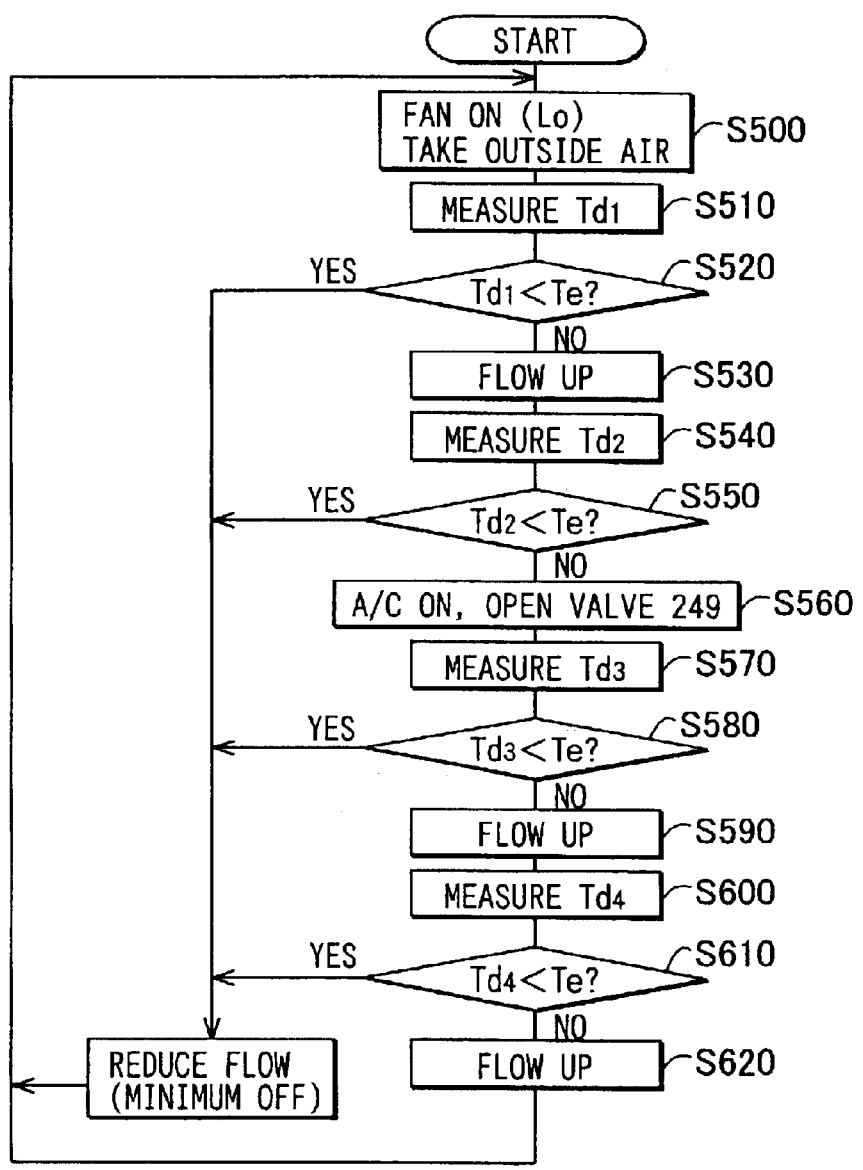
FIG. 11 is a flow chart showing a control flow of the battery temperature control device according to the sixth embodiment.

With reference to FIG. 10, in a sixth embodiment, in the temperature control device 100, which has the structure similar to that of the fourth or fifth embodiment, the air supply source switching device 242 is eliminated, and the battery 110 is cooled under one of the outside air aided cooling mode and the refrigeration system aided cooling mode (or the cooling means aided cooling mode). Here, the blower 246 and the casing 241 cooperatively serve as an air passage, and an air intake opening 260 of the blower 246 serves as an air intake opening of the air passage. A control flow of the temperature control device 100 of the sixth embodiment will be described with reference to a flow chart of FIG. 11.

When the ignition switch of the vehicle is turned on, cooling of the battery 110 under the outside air aided cooling mode is initiated while the amount of air flow generated by the blower 246 is minimized at S500.

Next, a temperature of the battery 110 is measured at S510. Then, it is determined whether the measured battery temperature Td1 is less than the temperature Te of the intake air (i.e., the temperature measured with the cooling air temperature sensor 250) at S520. When it is determined that the battery temperature Td1 is less than the temperature Te, the amount of air flow generated by the blower 246 is minimized, or the blower 246 is stopped, and control returns to S500. On the other hand, when it is determined that the battery temperature Td1 is equal to or greater than the temperature Te, the current cooling mode is maintained, and the amount of air flow generated by the blower 246 is increased to the intermediate amount (Me) that is greater than the minimum amount and is less than the maximum amount at S530.

Next, a temperature of the battery 110 is measured once again at S540. Then, it is determined whether the measured battery temperature Td2 is less than the temperature Te at S550. When it is determined that the battery temperature Td2 is less than the temperature Te, the amount of air flow generated by the blower 246 is minimized, or the blower 246 is stopped, and control returns to S500. On the other hand, when it is determined that the battery temperature Td2 is equal to or greater than the temperature Te, the amount of air flow generated by the blower 246 is minimized, and the battery 110 is cooled under the refrigeration system aided cooling mode at S560.

Next, a temperature of the battery 110 is measured once again at S570. Then, it is determined whether the measured battery temperature Td3 is less than the temperature Te at S580. When it is determined that the battery temperature Td3 is less than the temperature Te, the amount of air flow generated by the blower 246 is minimized, or the blower 246 is stopped, and control returns to S500. On the other hand, when it is determined that the battery temperature Td3 is equal to or greater than the temperature Te, the amount of air flow generated by the blower 246 is increased to the intermediate amount (Me) that is greater than the minimum amount and is less than the maximum amount at S590.

Next, a temperature of the battery 110 is measured once again at S600. Then, it is determined whether the measured battery temperature Td4 is less than the temperature Te at S610. When it is determined that the battery temperature Td4 is less than the temperature Te, the amount of air flow generated by the blower 246 is minimized, or the blower 246 is stopped, and control returns to S500. On the other hand, when it is determined that the battery temperature Td4 is equal to or greater than the temperature Te, the amount of air flow generated by the blower 246 is increased to the maximum amount (Hi) at S620. The above described steps S500 to S620 serve as a mode setting means.

As described above, in the sixth embodiment, although the inside air aided cooling mode is not used, the battery 110 is cooled under one of the outside air aided cooling mode and the refrigeration system aided cooling mode. Thus, the battery 110 can be effectively cooled while the fuel consumption of the vehicle is improved.

(Seventh Embodiment)

Figure 12:
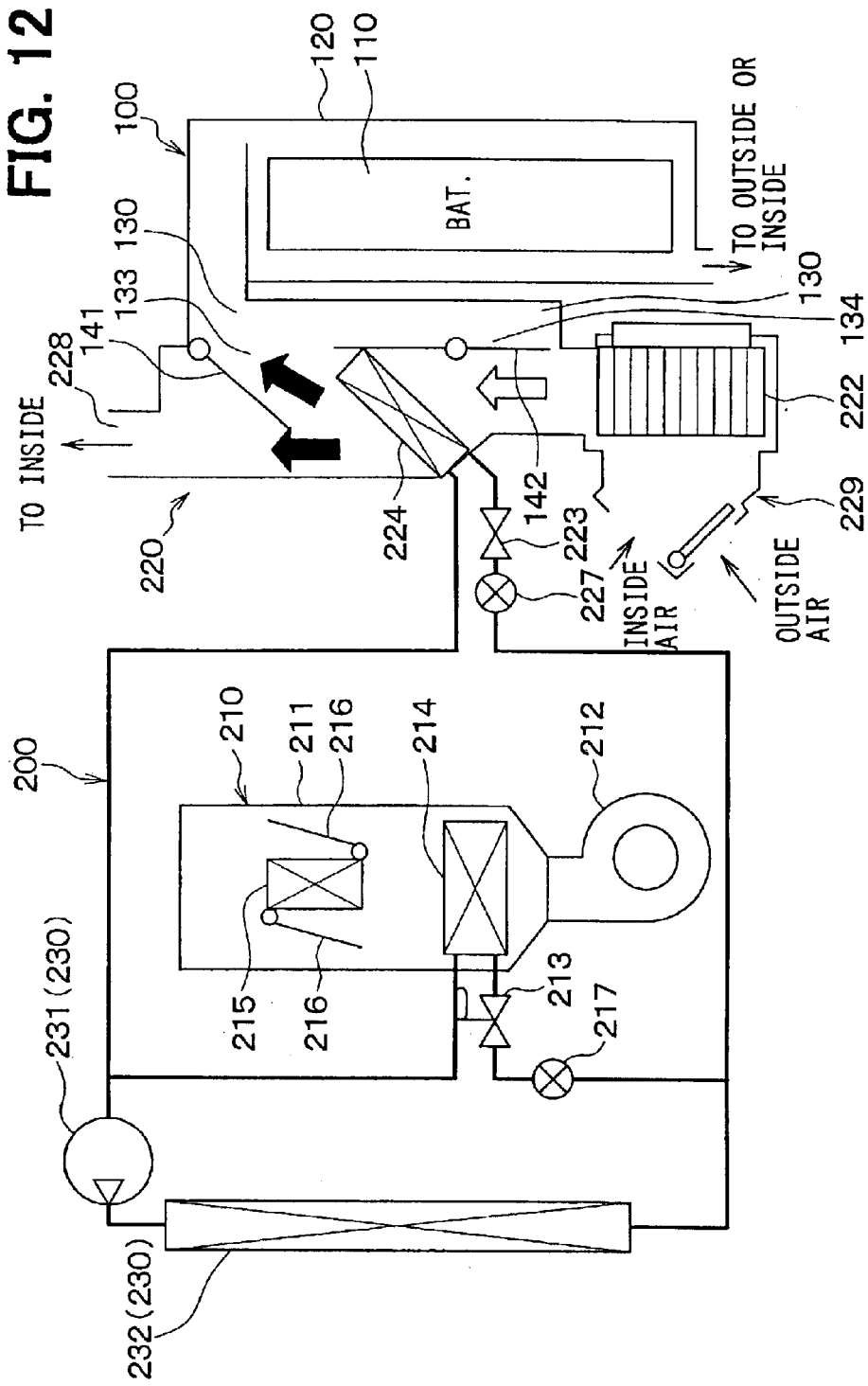
FIG. 12 is a schematic view showing a battery temperature control device according to a seventh embodiment of the present invention.

In a seventh embodiment, as shown in FIG. 12, a first intake port 133, a second intake port 134, a first closure door 141 and a second closure door 142 are provided. The air, which has passed through the second evaporator (air cooling means) 224, is supplied to the battery 110 through the first intake port 133. The air, which has not passed through the second evaporator 224, is supplied to the battery 110 through the second intake port 134. The first closure door 141 opens and closes the first intake port 133 and a passenger compartment outlet opening 228 of the rear unit 220. The second closure door 142 opens and closes the second intake port 134. In the seventh embodiment, the battery 110 is cooled while a substantial change in the state of the air in the passenger compartment, i.e., the air-conditioning state of the passenger compartment by the rear unit 220 is avoided.

An air supply source switching unit 229 adjusts the amount of inside air supplied to the rear unit 220 and the amount of outside air supplied to the rear unit 220.

Figure 13:
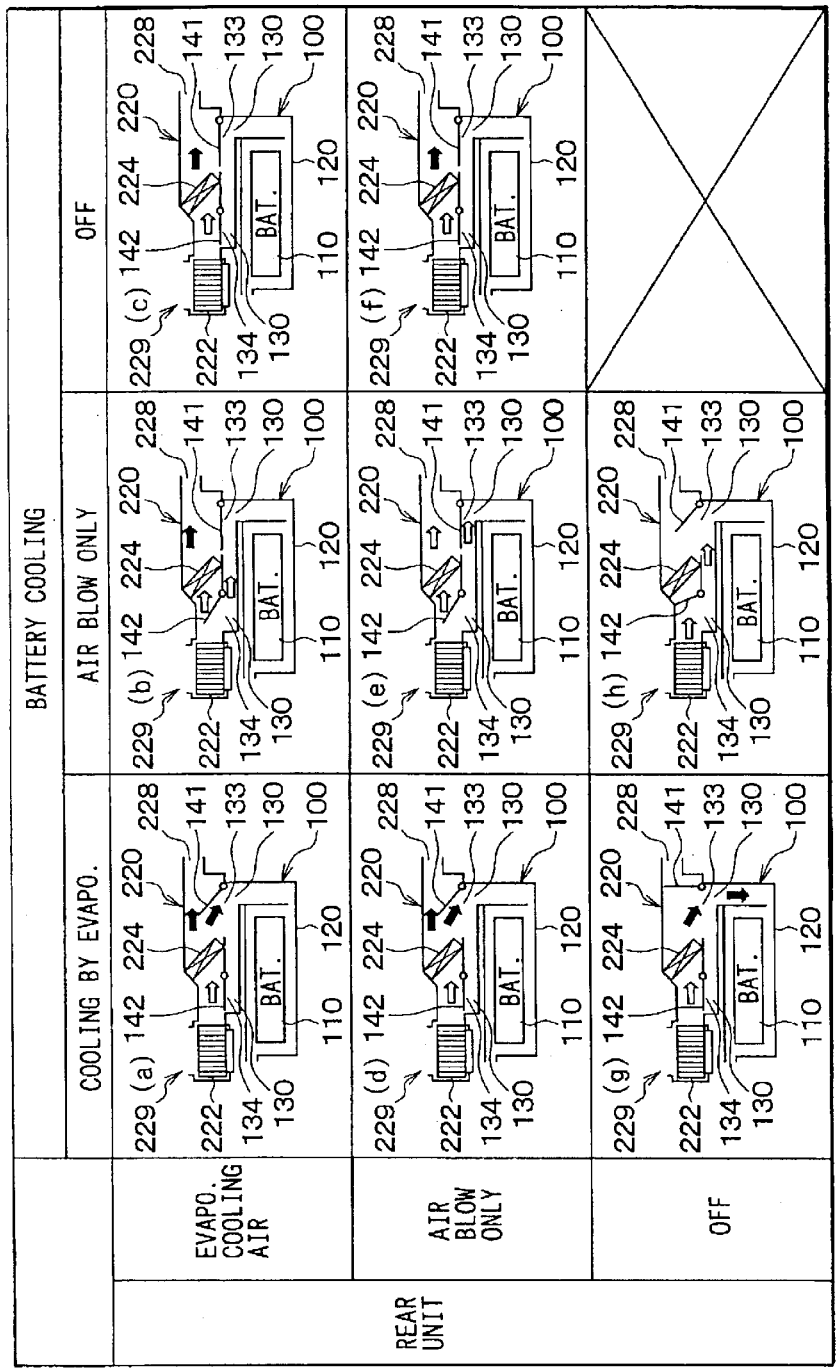
FIG. 13 is a diagram sowing various operational states of the battery temperature control device according to the seventh embodiment.

Characteristic operation of the seventh embodiment will be described with reference to FIG. 13.

1. A state where a start switch of the rear unit 220 is turned on, and the second electromagnetic valve 227 is opened, and thus the second evaporator 224 has a refrigerating capacity, and the battery temperature Tb is greater than a predetermined temperature c ("a" in FIG. 13).

Here, the predetermined temperature c corresponds to the level 3 of the battery temperature.

The second intake port 134 is closed, and the first closure door 141 is half-opened, so that the air cooled by the second evaporator 224 is supplied to the battery 110 and the passenger compartment.

In this way, the battery 110 can be cooled while the cooling operation of the passenger compartment rear side is maintained to avoid a substantial change in the state of the air in the passenger compartment rear side.

2. A state where the start switch of the rear unit 220 is turned on, and the second electromagnetic valve 227 is opened, and thus the second evaporator 224 has the refrigerating capacity, and the battery temperature Tb is equal to or less than the predetermined temperature c ("b" in FIG. 13).

The first intake port 133 is closed, and the second closure door 142 is half-opened, so that while the air, which has been cooled by the second evaporator 224, is supplied to the passenger compartment, the battery 110 is cooled by the blown air.

In this way, the battery 110 can be cooled while the cooling operation of the passenger compartment rear side is maintained to avoid a substantial change in the state of the air in the passenger compartment rear side.

3. A state where the start switch of the rear unit 220 is turned on, and the second electromagnetic valve 227 is opened, and thus the second evaporator 224 has the refrigerating capacity, and there is no need to make the battery temperature Tb less than the predetermined temperature c ("c" in FIG. 13).

The first intake port 133 and the second intake port 134 are closed, and the cooling operation of the passenger compartment rear side is maintained.

4. A state where the start switch of the rear unit 220 is turned on, and the second electromagnetic valve 227 is closed, and thus the second evaporator 224 has no refrigerating capacity, and the battery temperature Tb is greater than the predetermined temperature c ("d" in FIG. 13).

The second electromagnetic valve 227 is forcefully opened to cool the battery 110, and the first closure door 141 is half-opened while the second intake port 134 is closed, so that the air, which has been cooled by the second evaporator 224, is supplied to the battery 110 and to the passenger compartment.

At this time, it is desirable that the amount of air flow, which is supplied to the passenger compartment outlet opening 228, is decreased in comparison to the amount of air flow before opening of the second electromagnetic valve 227 to restrain avoid a substantial change in the state of the air in the passenger compartment rear side.

5. A state where the start switch of the rear unit 220 is turned on, and the second electromagnetic valve 227 is closed, and thus the second evaporator 224 has no refrigerating capacity, and the battery temperature Tb is equal to or less than the predetermined temperature c ("e" in FIG. 13).

The second closure door 142 is half-opened while the first intake port 133 is closed, and the battery is cooled by the blown air. At this time, the second electromagnetic valve 227 is kept closed.

In this way, the battery 110 can be cooled while the cooling operation of the passenger compartment rear side is maintained to restrain avoid a substantial change in the state of the air in the passenger compartment rear side.

In the above case, when the first closure door 141 is half-opened, and the second intake port 134 is closed, the advantage similar to the above advantage can be achieved.

6. A state where the start switch of the rear unit 220 is turned on, and the second electromagnetic valve 227 is closed, and thus the second evaporator 224 has no refrigerating capacity, and there is no need to make the battery temperature Tb less than the predetermined temperature c ("f" in FIG. 13).

The first intake port 133 and the second intake port 134 are closed while the second electromagnetic valve 227 is closed, and the cooling operation of the passenger compartment rear side is maintained.

7. A state where the start switch of the rear unit 220 is turned off, and the second evaporator 224 has no refrigerating capacity, and the battery temperature Tb is greater than the predetermined temperature c ("g" in FIG. 13).

The second electromagnetic valve 227 is forcefully opened to cool the battery 110, and the second blower 222 is operated. Furthermore, the second intake port 134 is closed, and the first intake port 133 is fully opened while the passenger compartment outlet opening 228 is closed.

In this way, the battery 110 can be cooled while the cooling operation of the passenger compartment rear side is stopped to restrain avoid a substantial change in the state of the air in the passenger compartment rear side.

8. A state where the start switch of the rear unit 220 is turned off, and the second evaporator 224 has no refrigerating capacity, and the battery temperature Tb is equal to or less than the predetermined temperature c ("h" in FIG. 13).

The first intake port 133 and the second intake port 134 are opened such that the air flow toward the passenger compartment outlet opening 228 is avoided Then, the second blower 222 is operated. At this time, the second electromagnetic valve 227 is kept closed.

In this way, the battery 110 can be cooled while the cooling operation of the passenger compartment rear side is stopped to avoid a substantial change in the state of the air in the passenger compartment rear side.

9. A state where the start switch of the rear unit 220 is turned off, and the second evaporator 224 has no refrigerating capacity, and there is no need to make the battery temperature Tb less than the predetermined temperature c.

The second blower 222 is turned off. The states of the first closure door 141 and the second closure door 142 are kept at those of first closure door 141 and the second closure door 142 before turning off of the second blower 222.

Figures 14, 15:
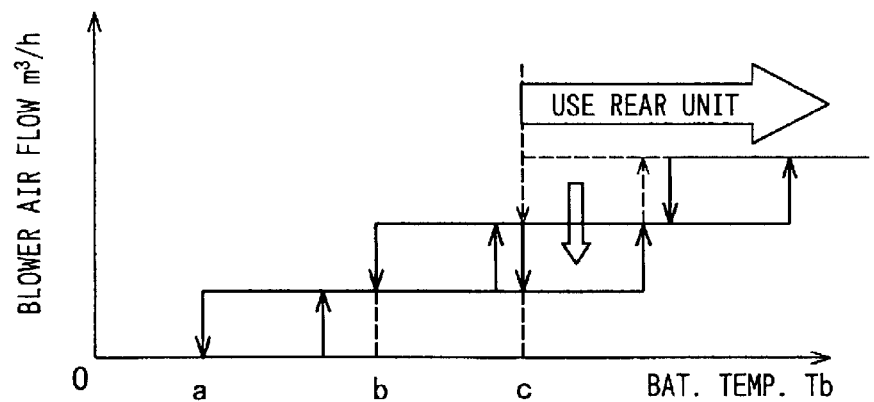
FIG. 14 is a diagram showing the states of the battery temperature control device with reference to a battery temperature according to the seventh embodiment.
FIG. 15 is a graph showing an amount of air flow and a battery temperature of a second blower in the battery temperature control device according to the seventh embodiment.

FIG. 14 shows the above states 1–9. The temperature of the inside air and the temperature of the outside air are compared with each other, and one of the inside air and the outside air having the lower temperature is introduced into the rear unit 220.

FIG. 15 shows a relationship between the amount of air flow of the second blower 222 and the battery temperature Tb. As the battery temperature Tb increases, the amount of air flow is increased in a stepwise manner.

Advantages of the seventh embodiment will be described.

As described above, the cooling mode for cooling the battery 110 is selected based on the battery temperature Tb and the operational state of the rear unit 220. Thus, an excessive increase in the power consumption of the compressor 231 is avoided while the air-conditioning operation and the battery cooling operation are balanced.

(Eighth Embodiment)

Figure 16:
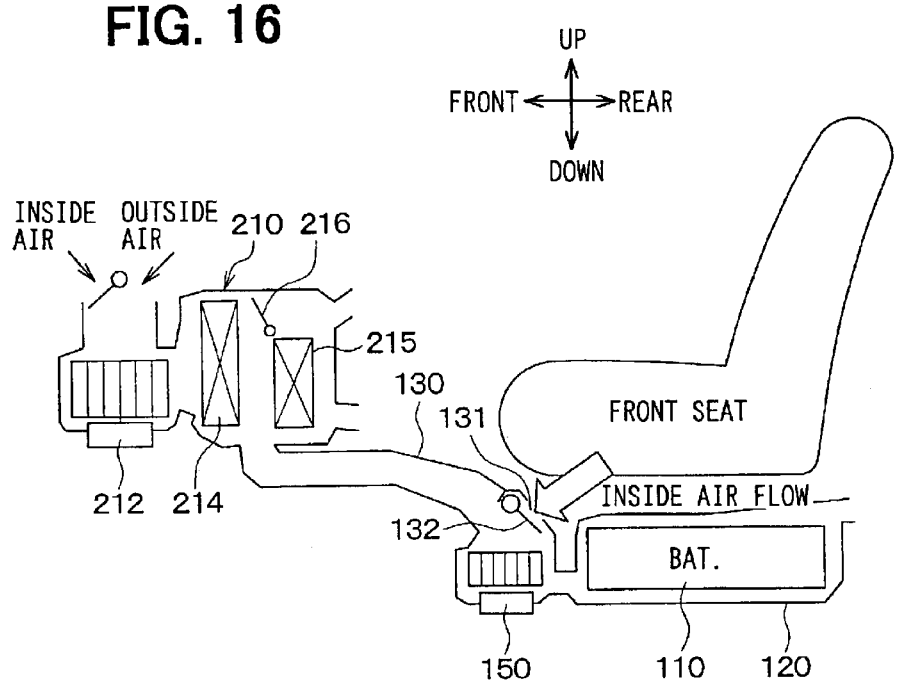
FIG. 16 is a schematic view showing a battery temperature control device according to an eighth embodiment of the present invention.

With reference to FIG. 16, in an eighth embodiment of the present invention, in the front unit (serving as an air-conditioning unit) 210, the air is taken from a point, which is located on the downstream side of the first evaporator (serving as an air cooling means) 214 and is on the upstream side of the first heater core (serving as an air heating means) 21, to supply the cooling air to the battery 110.

An inside air intake opening 131 and a switching door 132 are provided in the duct (serving as the air passage) 130. The air intake opening 131 and the switching door 132 serve as an inside air supplying means. The switching door 132 opens the inside air intake opening 131 to supply the inside air to the battery 110 and closes the inside air intake opening 131 to supply the air supplied from the front unit 210 to the battery 110.

Although the duct 130 is connected to the point between the first evaporator 214 and the first heater core 215 in the front unit 210, the duct 130 can be constructed from a preexisting duct, such as a heat pipe, a rear face duct or the like.

Furthermore, in the eighth embodiment, although the air, which has cooled the battery 110, is discharged to the outside of the passenger compartment, this air can be alternatively discharged into the passenger compartment.

Figure 17:
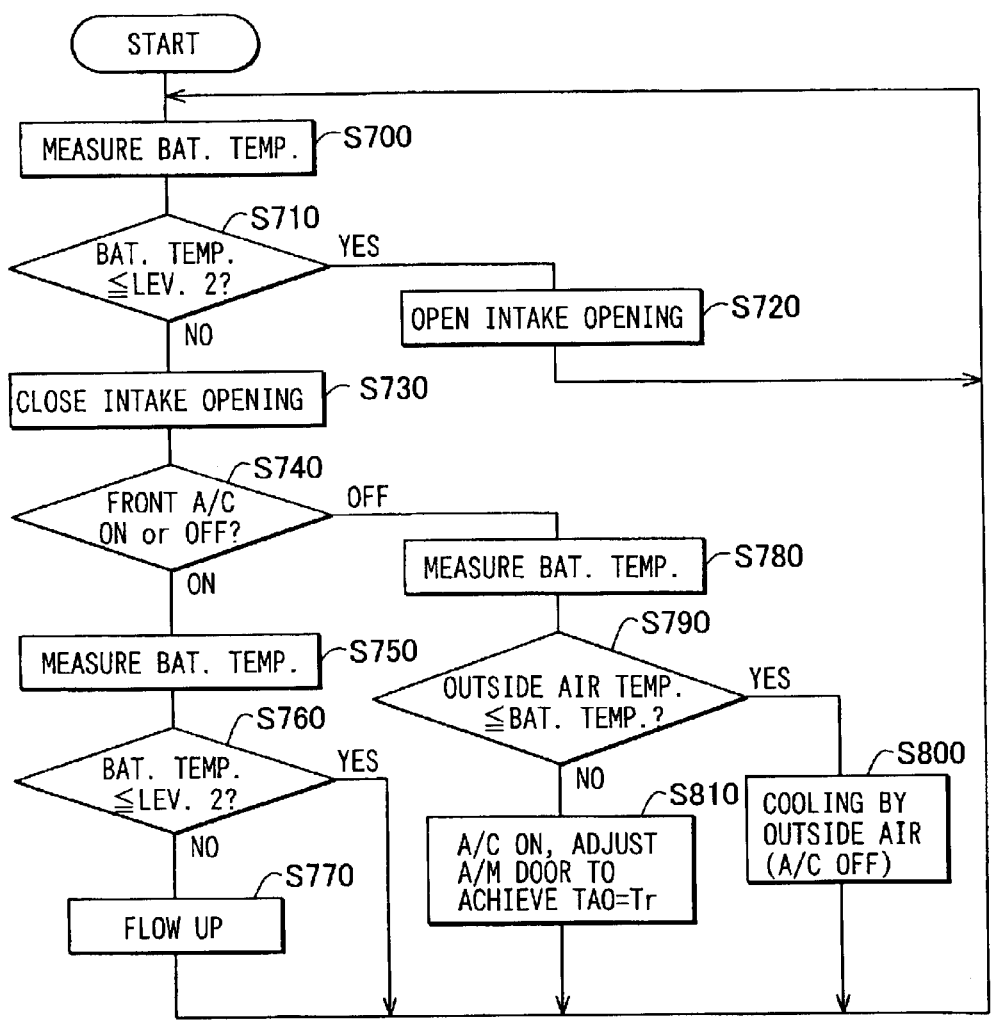
FIG. 17 is a flow chart showing a control flow of the battery temperature control device according to the eighth embodiment.

Characteristic operation of the eighth embodiment will be described with reference to a flow chart shown in FIG. 17.

When the ignition switch of the vehicle is turned on, a temperature of the battery 110 is measured, and the battery temperature level is determined at S700. At the same time, the blower 150 is operated according to a map shown in FIG. 18.

Next, it is determined whether the battery temperature level is equal to or less than the level 2 at S710. When it is determined that the battery temperature level is equal to or less than the level 2, the inside air intake opening 131 is opened to cool the battery 110 with the inside air at S720.

On the other hand, when it is determined that the battery temperature level is greater than the level 2 at S710, the inside air intake opening 131 is closed to allow supply of the air supplied from the front unit 210 to the battery 110 at S730. Then, it is determined whether the front unit 210 is currently operated at S740. Whether the front unit 210 is currently operated is determined based on a state of the start switch of the front unit 210.

Figure 18:
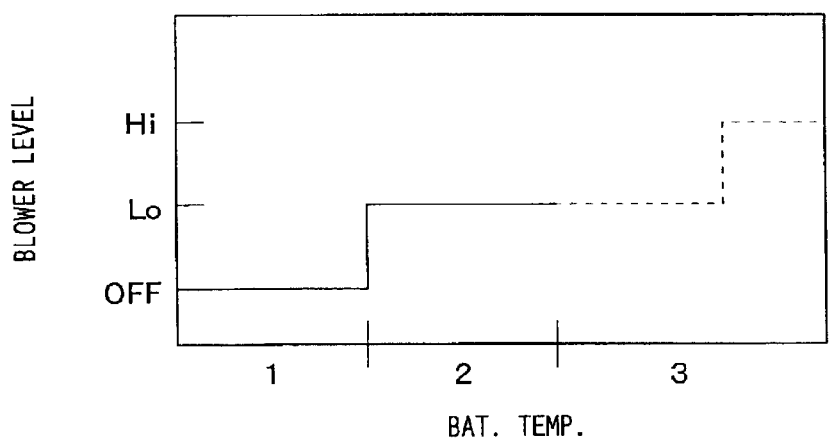
FIG. 18 is a graph showing a relationship between a battery temperature level and a blower level according to the eighth embodiment.

Then, when it is determined that the front unit 210 is currently operated at S740, a temperature of the battery 110 is measured at S750, and the battery temperature level is determined, so that the blower 150 is operated according to the map shown in FIG. 18 at S760. Whether the battery temperature level is equal to or less than the level 2 is determined at S710, so that when "No" is returned at S760, and the amount of air flow generated by the blower 150 is increased at S770.

When it is determined that the front unit 210 is not operated at S740, a temperature of the battery 110 is measured at S780. Then, the measured temperature of the battery 110 is compared with the temperature of the outside air (i.e., the measured temperature of the outside air temperature sensor 251) at S790.

When the temperature of the battery 110 is equal to or greater than the temperature of outside air, the front unit 210 is switched to the outside air intake mode at S800, so that the outside air taken through the front unit 210 is supplied to the battery 110 to cool the battery 110. It should be understood that the first blower 212 can be operated at this time. The step S800 serves as a forceful outside air aided cooling means.

On the other hand, when it is determined that the temperature of the outside air is greater than the temperature of the battery 110 at S790, a substantial change in the state of the air in the passenger compartment is avoided, for example by forcefully operating the front unit 210 and adjusting a degree of opening of the first air mix (AIM) door 216 in such a manner that a target outlet air temperature TAO corresponds to a passenger compartment air temperature Tr, and cooing air is conducted from the front unit 210 to the battery casing 120 to cool the battery 110 at S810. Here, the step S810 serves as an inside air state maintaining means and also a forceful air-conditioning aided cooling means.

Next, advantages of the eighth embodiment will be described.

In the eighth embodiment, the air supplied from the front unit 210 is conducted to the battery 110 to cool the battery 110. Thus, even when the battery 110 is arranged beneath the front seat, the battery 110 can be easily cooled.

Furthermore, in the case where the battery 110 can be cooled by the outside air, the battery 110 is cooled by the outside air, so that the energy required for cooling the battery can be reduced.

Also, when the front unit 210 is forcefully operated, the battery 110 is cooled by the air supplied to the battery casing 120 from the front unit 210 while restraining a substantial change in the state of the air in the passenger compartment. Thus, it is possible to avoid deterioration of the sensations of air-conditioning (e.g., comfort sensation, draft sensation) of the passenger.

In the eighth embodiment, one of the inside air taken directly from the passenger compartment and the air supplied from the front unit 210 is supplied to the battery 110 by changing the position of the switching door 132. This can be modified as follows. That is, a degree of opening of the switching door 132 is adjusted such that the inside air and the air supplied from the front unit 210 are mixed and are supplied to the battery 110 to adjust the temperature of the air supplied to the battery 110.

(Other Embodiment)

In the first and third embodiments, the second evaporator 224 serves as the air temperature adjusting means for adjusting the temperature of the air to be discharged into the passenger compartment. In the second embodiment, the second evaporator 224 and the second air mix door 226 serve as the air temperature adjusting means. However, the present invention is not limited to these arrangements.

Furthermore, in the first and second embodiments, the closure door 140 serves as the battery directed air flow adjusting means for adjusting the amount of air flow supplied to the battery 110. In the third embodiment, the blower 150 serves as the battery directed air flow adjusting means. However, the present invention is not limited to these arrangements.

In the first to third embodiments, the amount of air flow generated by the blower 222 and the degree of opening of the closure door 140 are controlled in the stepwise manner. However, the present invention is not limited to this. For example, the amount of air flow generated by the blower 222 and the degree of opening of the closure door 140 can be controlled in a continuous linear manner.

In the fourth to sixth embodiments, the amount of air flow generated by the blower 246 is progressively increased. However, the present invention is not limited to this.

Additional advantages and modifications will readily occur to those skilled in the art. The invention in its broader terms is therefore, not limited to the specific details, representative apparatus, and illustrative examples shown and described.

What is claimed is:

1. A battery temperature control device for controlling the temperature of a battery installed in a vehicle, the battery temperature control device comprising:

a rear air-conditioning unit, which is arranged at a rear side of the vehicle and includes an air temperature adjusting means for adjusting the temperature of air discharged from the rear air-conditioning unit into a passenger compartment of the vehicle; and an air passage, which conducts air from a downstream side of the air temperature adjusting means to the battery, so that the air that has passed through the air temperature adjusting means is supplied to the battery to control the temperature of the battery; wherein the battery temperature control device controls the air temperature adjusting means to cool air regardless of an air-conditioning heat load in the passenger compartment and supplies the cooled air to the battery through the air passage when the temperature of the battery is equal to or greater than a predetermined temperature.

2. A battery temperature control device according to claim 1, further comprising a battery directed air flow adjusting means for adjusting an amount of air flow supplied to the battery through the air passage.

3. A battery temperature control device according to claim 1, wherein the battery temperature control device operates the air temperature adjusting means based on the air-conditioning heat load and adjusts the amount of air flow supplied to the battery through the air passage to control the temperature of the battery when the temperature of the battery is less than the predetermined temperature.

4. A battery temperature control device for controlling the temperature of a battery installed in a vehicle, the battery temperature control device comprising:
   an air passage, which includes an outside air intake opening and an inside air intake opening and receives the battery therein;
   an air cooling means for cooling air, wherein the air cooling means is located in the air passage on an upstream side of the battery; and
   a mode setting means for selecting one of:
      an outside air aided cooling mode for cooling the battery by outside air, which is taken from outside the passenger compartment through the outside air intake opening of the air passage;
      an inside air aided cooling mode for cooling the battery by inside air, which is taken from outside the passenger compartment through the inside air intake opening of the air passage; and
      a cooling means aided cooling mode for cooling the battery by air, which is cooled by the air cooling means; wherein
   the mode setting means selects one of the modes by sequentially determining whether each mode is appropriate in the following order: the outside air aided cooling mode, the inside air aided cooling mode and the cooling means aided cooling mode.

5. A battery temperature control device for controlling the temperature of a battery installed in a vehicle, the battery temperature control device comprising:
   an air passage, which includes an outside air intake opening and an inside air intake opening and receives the batten, therein;
   an air cooling means for cooling air, wherein the air cooling means is located in the air passage on an upstream side of the battery; and
   a mode setting means for selecting one of:
      an outside air aided cooling mode for cooling the battery by outside air, which is taken from outside the passenger compartment through the outside air intake opening of the air passage;
      an inside air aided cooling mode for cooling the battery by inside air, which is taken from inside the passenger compartment through the inside air intake opening of the air passage; and
      a cooling means aided cooling mode for cooling the battery by air, which is cooled by the air cooling means; wherein
   the mode setting means includes:
      a first determining means for determining whether the outside air aided cooling mode needs to be carried out by comparing the temperature of the outside air with the temperature of the battery; and
      a second determining means for determining whether the inside air aided cooling mode needs to be carried out by comparing the temperature of the inside air and the temperature of the battery, wherein the mode setting means executes the first determining means prior to execution of the second determining means.

6. A battery temperature control device for controlling the temperature of a battery installed in a vehicle, the battery temperature control device comprising:
   an air passage, which includes an outside air intake opening and an inside air intake opening and receives the battery therein;
   an air cooling means for cooling air, wherein the air cooling means is located in the air passage on an upstream side of the battery; and
   a mode setting means for selecting one of:
      an outside air aided cooling mode for cooling the battery by outside air, which is taken from outside the passenger compartment through the outside air intake opening of the air passage;
      an inside air aided cooling mode for cooling the battery by inside air, which is taken from inside the passenger compartment through the inside air intake opening of the air passage; and
      a cooling means aided cooling mode for cooling the battery by air, which is cooled by the air cooling means; wherein
   the mode setting means increases an amount of flow of the air supplied to the battery through the air passage before proceeding from a current cooling mode, which is selected from the outside air aided cooling mode, the inside air aided cooling mode and the cooling means aided cooling mode, to a next cooling mode, which is selected fro the outside air aided cooling mode, the inside air aided cooling mode and the cooling means aided cooling mode.

7. A battery temperature control device according to claim 6, wherein the mode setting means reduces an amount of flow of the air supplied to the battery through the air passage when the current cooling mode is changed to the next cooling mode.

8. A battery temperature control device for controlling the temperature of a battery installed in a vehicle, the battery temperature control device comprising:
   an air passage, which includes an outside air intake opening and an inside air intake opening and receives the battery therein;
   an air cooling means for cooling air, wherein the air cooling means is located in the air passage on an upstream side of the battery; and
   a mode setting means for selecting one of:
      an outside air aided cooling mode for cooling the battery by outside air, which is taken from outside the passenger compartment through the outside air intake opening of the air passage;
      an inside air aided cooling mode for cooling the battery by inside air, which is taken from inside the passenger compartment through the inside air intake opening of the air passage;
      a cooling means aided cooling mode for cooling the battery by air, which is cooled by the air cooling means; and
   a cooling air temperature sensor which is arranged in the air passage and measures the temperature of the air supplied to the battery.

9. A battery temperature control device for controlling the temperature of a battery installed in a vehicle, the battery temperature control device comprising:

an air-conditioning unit, wherein the air-conditioning unit includes:
- an air cooling means for cooling air to be discharged from the air-conditioning unit into a passenger compartment of the vehicle; and
- an air heating means for heating air to be discharged from the air-conditioning unit into the passenger compartment, wherein the air heating means is arranged on a downstream side of the air cooling means;
- an air passage, which conducts air from the air-conditioning unit to the battery, wherein the air passage is connected to the air-conditioning unit at a point, which is located on a downstream side of the air cooling means and also on an upstream side of the air heating means; and
- a forceful air-conditioning aided cooling means for operating the air-conditioning unit to cool the battery while limiting a substantial change in the state of the air in the passenger compartment when the air-conditioning unit is stopped, and the temperature of the battery is equal to or greater than a predetermined temperature.

10. A battery temperature control device according to claim 9, further comprising an inside air supplying means for supplying inside air, which is taken from inside the passenger compartment, to the battery.

11. A battery temperature control device according to claim 9, further comprising an inside air state maintaining means for limiting a substantial change in the state of the air in the passenger compartment when the battery is cooled.

12. A battery temperature control device according to claim 9, further comprising a forceful outside air aided cooling means for taking outside air from outside the passenger compartment through the air-conditioning unit and for supplying the outside air to the battery when the air-conditioning unit is stopped.

* * * * *